(12) United States Patent
Suzuki

(10) Patent No.: US 8,017,999 B2
(45) Date of Patent: Sep. 13, 2011

(54) SEMICONDUCTOR DEVICE

(75) Inventor: Shinya Suzuki, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 340 days.

(21) Appl. No.: 11/896,718

(22) Filed: Sep. 5, 2007

(65) Prior Publication Data

US 2008/0116462 A1 May 22, 2008

(30) Foreign Application Priority Data

Sep. 28, 2006 (JP) .................... 2006-265368

(51) Int. Cl.
*H01L 23/62* (2006.01)
(52) U.S. Cl. . 257/355; 257/776; 257/360; 257/E29.219; 327/170
(58) Field of Classification Search .......... 257/72, 257/355, 776, 360, E29.219; 327/170
See application file for complete search history.

(56) References Cited

U.S. PATENT DOCUMENTS

| 6,322,903 B1 * | 11/2001 | Siniaguine et al. ........ 428/617 |
| 7,102,223 B1 | 9/2006 | Kanaoka et al. |
| 2004/0251940 A1 * | 12/2004 | Hayashi et al. ........... 327/170 |

FOREIGN PATENT DOCUMENTS

| JP | 2002-246470 | 8/2002 |
| JP | 2004-95577 | 3/2004 |

* cited by examiner

*Primary Examiner* — Thanh V Pham
*Assistant Examiner* — Mark A Laurenzi, III
(74) *Attorney, Agent, or Firm* — Miles & Stockbridge P.C.

(57) ABSTRACT

An output side of a driver output circuit of an LCD driver includes a first protective element having an n-type semiconductor region and a p-type semiconductor region formed in the n-type semiconductor region, and a second protective element having a p-type semiconductor region and an n-type semiconductor region formed in the p-type semiconductor region. The first and second protective elements are arranged in twos, respectively, adjacent to each other.

14 Claims, 19 Drawing Sheets

SEMICONDUCTOR DEVICE

BACKGROUND OF THE INVENTION

The present invention relates to a semiconductor device and, more particularly to a technique useful for a driver IC (Integrated Circuit) used in a liquid crystal display (LCD).

An LCD is composed of a plurality of pixels arranged vertically and horizontally, which are units to display pictures and characters. An increase in the number of pixels makes a curved line displayed smoother, resulting in higher definition image. When a color image is displayed, three primary colors red (R), green (G), and blue (B) are combined to constitute one pixel.

An LCD using a thin film transistor (TFT) as a switch for active matrix system, which is a method for driving the pixels, is composed of a glass substrate over which first wires and second wires are arranged in vertical lines and horizontal lines respectively, and the TFTs that serve as the switches are arranged at the intersections of the lines, and a liquid crystal layer, into which a liquid crystal material is sealed, is arranged in the vicinity of each switch. In the LCD, by applying an address signal to the second wire in each line, the TFTs in each line are switched into conductive state and data signals supplied from the first wire are written into the liquid crystal layers (pixels). On the other hand, the TFTs in the line to which the address signal is not applied remain in a non-conductive state and the previously written data remain on hold (stored).

In addition, the driver IC configured to drive the liquid crystal of an LCD (hereinafter, referred to as "LCD driver") is composed together with semiconductor circuits, such as a driver output circuit, a logic circuit, etc., formed over the main surface of a semiconductor chip (semiconductor substrate). Over the main surface of the semiconductor chip constituting the LCD driver, bumps are provided as external electrodes for, for example, outputting signals from the driver output circuit to the source lines and the gate lines, and pads are also provided under the bumps for forming the bumps. Owing to this arrangement, in order to preserve the bonding strength and the bonding precision, or to meet the specifications required by assembly process of the semiconductor chip, the dimensions of the pad cannot be reduced compared to the reduction in dimensions of the semiconductor circuits, such as a driver output circuit, a logic circuit, etc., and interconnect wires.

In Japanese patent laid-open No. 2004-95577 (patent document 1), a technique is disclosed, which makes the height of a plurality of pads uniform by uniformly flattening the surface under the pads which are placed over the region of the semiconductor circuit and the interconnect wires over the main surface of the semiconductor chip.

Further, in Japanese patent laid-open No. 2002-246470 (patent document 2), a technique is disclosed, which provides a protective element between the connection of a pad and a semiconductor circuit (for example, a driver output circuit) in order to prevent an electrostatic breakdown in the semiconductor circuit in an LCD driver.

SUMMARY OF THE INVENTION

FIG. 1 is a diagram for illustrating a mobile phone 51 containing an LCD driver 101 that the inventors of the present invention are examining.

As shown in FIG. 1, the mobile phone 51 includes the LCD driver 101 that the inventors of the present invention are examining, a glass substrate 52, a heat seal 53, and a printed circuit board 54. The LCD driver 101 is mounted on the glass substrate 52 constituting a liquid crystal display 55, and connected, via the heat seal 53, to the printed circuit board 54 on which a microcomputer (not shown) is mounted. The periphery of the liquid crystal display 55 is covered with a frame 51a attached to the mobile phone 51. The periphery of the liquid crystal display 55 includes a region on which the LCD driver 101 is mounted.

FIG. 2 is a diagram for illustrating a circuit system of the liquid crystal display 55 that the inventors of the present invention are examining.

As shown in FIG. 2, source lines 56 extending in Y-direction and gate lines 57 extending in X direction are arranged in a matrix to intersect each other. On extension lines of the source line 56 and the gate line 57, signal input terminals 58 and signal input terminals 59 are arranged, respectively. Further, at the intersection of the source line 56 and the gate line 57, a TFT 60 is provided and the drain of the TFT 60 is connected to a pixel electrode 61 and the pixel electrode 61 is in opposition to a counter electrode 63 via a liquid crystal layer 62. Here, the pixel can be regarded as a capacitor configured to sandwich the liquid crystal layer 62 between the pixel electrode 61 and the counter electrode 63. Furthermore, on the outer circumference of the liquid crystal display 55, a short ring 64 configured to electrically short-circuit the source lines 56 and gate lines 57 is provided.

An address signal is supplied to the gate of the TFT 60 from the LCD driver 101 through the signal input terminal 59 and the gate line 57 and a data signal is supplied to the source from the LCD driver 101 through the signal input terminal 58 and the source line 56. Since the liquid crystal layer 62 constituting the pixel is arranged at the intersection of the gate line 57 and the source line 56, pixels corresponding to one row are selected by the gate line 57 and video data is written in the liquid crystal layer 62 by the source line 56. With this arrangement, one screen is displayed by selecting the gate lines 57 in sequence. Within the time period of the selection of each gate line 57, the data signal is supplied sequentially to the source lines 56 and necessary data is written (accumulated) to the pixels (capacitor) via the TFTs 60. The written data is retained until the next data signal is supplied and rewrite is carried out by the supply of the next address signal. Due to the retaining property, a voltage corresponding to the data is retained and the data is displayed on the liquid crystal display 55.

FIG. 3 is a diagram for illustrating the LCD driver 101 that the inventors of the present invention are examining and the layout of the pads 16 formed over the LCD driver 101. Although not shown, over the main surface (element forming surface) of a semiconductor chip 11 constituting the LCD driver 101, a driver output circuit, a logic circuit, a graphic RAM, etc., are formed and bumps that serve as external electrode terminals are formed over the pads 16.

As shown in FIG. 3, the semiconductor chip 11 constituting the LCD driver 101 has a planar shape of an elongated rectangle. For example, when the screen size of the liquid crystal display 55 of the mobile phone 51 shown in FIG. 1 is increased in the X and Y directions, one possible choice is the reduction in size of the LCD driver 101 mounted on the glass substrate 52 constituting the screen. In particular, it is effective to reduce in size (to shorten the side of) the LCD driver 101 in the Y direction more than that in the X direction along the screen of the liquid crystal display 55. Because of this, the planar shape of the semiconductor chip 11 constituting the LCD driver 101 is the shape of an elongated rectangle.

On the side along the X direction (lengthwise direction) of the outer circumference of the semiconductor chip 11, a plurality of pads 16 and 17 is arranged. The pad 16 is configured to output the signal of the driver output circuit and is electrically connected to the driver output circuit via an interconnect wire (not shown). In addition, the pad 17 is configured to input the signal output from the microcomputer over the printed circuit board 54 shown in FIG. 1 via the heat seal 53.

For example, in the liquid crystal display 55 in FIG. 2, when the resolution is the QQVGA (160×120 pixels), 160 of the gate lines 57 and the 120×3 (RGB) of the source lines 56, that is, 520 lines in total are required and 520 of the pads 16 are also required accordingly. When the sides of the LCD driver 101 are to be shortened, all of the pads 16 should be placed on one side in the X direction of the semiconductor chip 11 as shown in FIG. 3, since it is desirable not to place the pads for the driver output circuit on both sides along the Y direction, as described above.

Also, in a protective element forming region 19, a protective element for protecting the driver output circuit against positive/negative surges (electrostatic breakdown) is formed. The protective element is electrically connected between the pad 16 and the driver output circuit and is, for example, a pn junction diode.

FIG. 4 is a plan view schematically showing critical parts of the LCD driver 101 that the inventors of the present invention are examining. FIG. 5 is a sectional view along Y-Y line in FIG. 4. Here, in FIG. 4, for easier understanding, only a plurality of protective elements 21a, 21b and the pads 16 in a see-through state, formed over the main surface of the semiconductor chip 11 are shown. FIG. 4 also shows a pitch (xa) between the pads 16 neighboring in the X direction of the LCD driver 101, and a size (ya), in the Y direction, of the protective element forming region 19, in which the protective elements 21a and the protective elements 21b laid out on a straight line in the Y direction are formed. In addition, a protective element area Sp of the protective element 21a, a protective element area Sn of the protective element 21b, and an isolation part 32 are shown with hatches. As described above, though the pad 16 is electrically connected to the driver output circuit, their connection is omitted.

In FIG. 4 and FIG. 5, a pair of diodes associated with one pad 16, namely, the two protective elements 21a, 21b for one output, for protecting the driver output circuit formed over the main surface of the semiconductor chip 11 against the positive/negative surges (electrostatic breakdown) will be described.

As shown in FIG. 4 and FIG. 5, one p-type semiconductor region 23 is formed in one n-type semiconductor region 22 (n-type well). In other words, the protective element 21a is a pn junction diode including the n-type semiconductor region 22 formed over the main surface of the semiconductor chip 11 composed of a p-type single crystal silicon substrate, and the p-type semiconductor region 23 formed in the n-type semiconductor region 22, and therefore, one diode is formed in one n-type semiconductor region 22.

Further, as shown in FIG. 4 and FIG. 5, one n-type semiconductor region 25 is formed in one p-type semiconductor region 24 (p-type well). In other words, the protective element 21b is a pn junction diode including the p-type semiconductor region 24 formed over the main surface of the semiconductor chip 11, and the n-type semiconductor region 25 formed in the p-type semiconductor region 24, and therefore, one diode is formed in one p-type semiconductor region 24.

These protective elements 21a, 21b are formed in the protective element forming region 19 of the semiconductor chip 11. In FIG. 4, the size (ya) in the Y direction of the protective element forming region 19 is shown.

Further, the protective element area Sp of the protective element 21a and the protective element area Sn of the protective element 21b require a certain area in order to ensure an electrostatic withstand voltage and the protective element areas Sp and Sn increase in area as the electrostatic withstand voltage becomes higher.

Over the top portion of the protective elements 21a, 21b, a multilayer interconnect wiring is formed and a case of four-layer wiring layers M1 to M4 formed in interlayer insulating films 26 is shown. The p-type semiconductor region 23 of the protective element 21a (anode of the diode constituting the protective element 21a) and the n-type semiconductor region 25 of the protective element 21b (cathode of the diode constituting the protective element 21b) are connected via the first wiring layer M1. The wiring layers M1 to M4 are interconnected to one another via contacts 27. Here, the wiring layer M4 is formed as the pad 16, and a bump 29, which is an external electrode, is formed over the pad 16 via an under-bump electrode 28. In this manner, the protective elements 21a, 21b are electrically connected with the pad 16 and the bump 29. In FIG. 4, the pitch (xa) between the neighboring pads 16 is shown.

Further, in the n-type semiconductor region 22, an n-type semiconductor region 30 is formed and led out via a contact (not shown) as the cathode of the diode constituting the protective element 21a. Also, in the p-type semiconductor region 24, a p-type semiconductor region 31 is formed and led out via a contact (not shown) as the anode of the pn junction diode constituting the protective element 21b. Further, over the main surface of the semiconductor chip 11, the isolation part 32 is formed.

Here, when the resolution of the liquid crystal display 55 is increased, for example, from the QQVGA to the QVGA with a higher definition, the number of outputs of a driver output circuit increases, that is, the number of pads 16 increases. In this case, in order to suppress the increase in chip size, it is necessary to narrow the pitch between the neighboring pads 16.

FIG. 6 and FIG. 7 are plan views schematically showing critical parts of LCD drives 102 and 103 the inventors of the present invention are examining in response to the increase in the number of outputs. The LCD drivers 102 and 103 are to cope with the increase in the number of outputs and the number of pads which is greater than that of LCD drivers 101. In the FIGS. 6 and 7, the protective element area Sp of the protective element 21a, the protective element area Sn of the protective element 21b, and the isolation part 32 are hatched.

As shown in FIG. 6, a pitch (xb) between the neighboring pads 16 laid out on a straight line in the X direction is shorter than the pitch (xa) shown in FIG. 4. Further, as shown in FIG. 7, a pitch (xc) between the neighboring pads 16 laid out in a staggered manner in the X direction is shorter than the pitch (xa) shown in FIG. 4. By thus narrowing the pitch, it is possible to cope with the increase in the number of outputs. As was explained using FIG. 4 and FIG. 5, also in FIG. 6 and FIG. 7, one p-type semiconductor region 23 is formed in one n-type semiconductor region 22 and one n-type semiconductor region 25 is formed in one p-type semiconductor region 24.

In addition, as shown in FIG. 6 and FIG. 7, accompanying the reduction in pitch between the neighboring pads 16, the shape of the pad 16 becomes shorter in the X direction and longer in the Y direction compared to that in FIG. 4 (an elongated shape). In order to the preserve the bonding strength, the bonding precision, etc., the dimensions of the pad 16 cannot be reduced compared to the reduction in dimension of the driver output circuit 12 and the interconnect wiring. Because of this, although the area of the pad 16 is about the same, the shape of the pad 16 is such one in which the length in the X direction is shorter and longer in the Y direction compared to that in FIG. 4.

As described above, it is necessary to arrange the protective elements 21a, 21b between the pad 16 and the driver output circuit 12 for one pad 16 in order to protect the driver output circuit 12 from an electrostatic breakdown. Because of this, when the number of outputs of the driver output circuit 12 increases, accompanying the increase in the number of pads 16, the number of protective elements 21a, 21b also increases and the protective element forming region 19 also extends according to the amount of the increase. In other words, the protective elements 21a, 21b require certain size of the protective element areas Sp, Sn, in order to ensure an electrostatic withstand voltage, and therefore, as the number of pads 16 increases, total area of the protective element areas Sp, Sn increase, and the protective element forming region 19 extends according to the amount of the increase.

For example, when the protective elements 21a, 21b are arranged, one possible choice is that the protective element areas Sp, Sn are formed into an elongated rectangular shape. In this case, in the Y direction of the region in which the protective elements 21a, 21b are formed over the semiconductor chip 11, a size (yb) in FIG. 6 and a size (yc) in FIG. 7 are longer than the size (ya) in the Y direction of the protective element forming region 19 in FIG. 4. Consequently, the shape of the semiconductor chip 11 becomes such one in which the length in the Y direction becomes longer and an attempt to shorten sides is no longer possible.

As described above, it is desirable to shorten the sides of the chip of the LCD driver 101 in the Y direction in order to increase the screen size of the liquid crystal display 55. However, only by making the protective element areas Sp, Sn in the shape of an elongated rectangular, in response to the increase in the number of outputs and the reduction in pitch, it is not possible to shorten the sides of, for example, the LCD drivers 102, 103 and the chip size of the semiconductor chip 11 constituting the LCD driver 101 increases.

An object of the present invention is to provide a technique capable of reducing the chip size of an LCD driver.

The above and further objects and novel features of the invention will more fully appear from the following detailed description in this specification and the accompanying drawings.

Preferred embodiments of the invention which will be disclosed herein are briefly outlined below.

A semiconductor device according to the present invention has, on the output side of a driver output circuit of an LCD driver, a first protective element comprising a first p-type semiconductor region and a first n-type semiconductor region formed in the first p-type semiconductor region, and a second protective element comprising a second n-type semiconductor region and a second p-type semiconductor region formed in the second n-type semiconductor region, and the first and second protective elements are laid out in twos or more, respectively, adjacent to each other.

The effect brought about by preferred embodiments of the present invention is briefly described as follows.

According to the semiconductor device of the present invention, it is possible to reduce the chip size of the LCD driver.

DETAILED DESCRIPTION OF THE PREFERRED EMBODIMENTS

Embodiments of the present invention will be described below in detail based on the drawings. In all of the drawings for illustrating the embodiments, the same members are attached with the same symbols as a general rule and duplicated description thereof is omitted. In addition a plan view may be hatched as the case may be.

First Embodiment

An LCD driver 1 in a first embodiment of the present invention is applied to a mobile phone 51 with a liquid crystal display 55 described with reference to FIG. 1 and FIG. 2. The LCD driver 1 is a driver IC that drives the liquid crystal of the liquid crystal display 55 and is comprised together with semiconductor circuits, such as a driver output circuit, a logic circuit, etc., formed over the main surface of the semiconductor chip (semiconductor substrate).

It is the trend that the resolution of the liquid crystal display 55 of the mobile phone increases to a higher definition, from the QQVGA (160×120 pixels) to the QVGA (320×240 pixels) and further, to the VGA (680×480 pixels). In accordance with this, the number of outputs from the LCD driver 1 to the liquid crystal display 55 is 520 outputs for the QQVG, 1,040 outputs for the QVGA, and 2,120 outputs for the VGA, in the case of a color display (RGB). In other words, when the LCD driver 1 is formed in a single chip, the number of outputs per chip increases as resolution shifts to higher definition. Because of this, in the LCD driver 1 in the first embodiment of the present invention, the neighboring pads 16 are spaced with a pitch distance in order to layout the pads 16 in a certain area (chip size) in response to the increase of the number of outputs.

Figure 8:
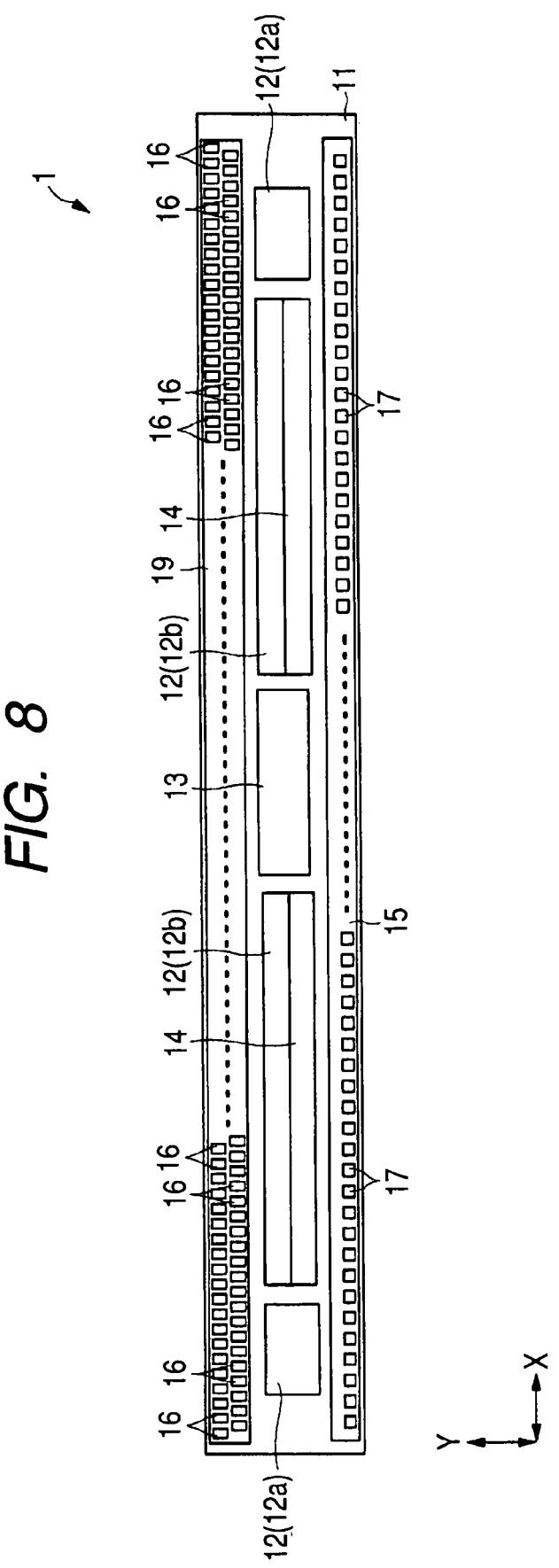
FIG. 8 is a diagram for illustrating the LCD driver in a first embodiment of the present invention and the layout of pads formed over the LCD driver.

FIG. 8 is a diagram for illustrating the LCD driver 1 in the first embodiment and the arrangement of semiconductor circuits etc. formed over the LCD driver 1.

Over the main surface of a semiconductor chip 11 constituting the LCD driver 11, a driver output circuit 12, a logic circuit 13, a graphic RAM 14, input terminals 15, and the protective elements in a protective element forming region 19 are formed and arranged as shown in FIG. 8. In addition, the pads 16 and 17 are placed on the sides along the X direction (the lengthwise direction) of the outer circumference of the semiconductor chip 11, the planar shape of which is the elongated rectangular shape.

As described above, the planar shape of the semiconductor chip 11 is an elongated rectangular shape. For example, when the screen size of the liquid crystal display 55 of the mobile phone 51 shown in FIG. 1 is to be increased in the X and Y directions, one possible choice is to reduce the size of the LCD driver 1 to be mounted on the glass substrate 52 constituting the screen. In particular, it is effective to reduce in size (to shorten the side of) the LCD driver 1 in the Y direction rather than in the X direction along the screen of the liquid crystal display 55. Because of this, the planar shape of the semiconductor chip 11 constituting the LCD driver 1 becomes the shape of an elongated rectangle.

The driver output circuit 12 that outputs a signal to the gate line 57 of the liquid crystal display 55 is called a gate driver (or common driver) 12a. Also, the driver output circuit 12 that outputs a signal to the source line 56 is called a source driver (or segment driver) 12b. The address signal is output from the gate driver 12a and the data signal is output from the source driver 12b.

The gate driver 12a and the source driver 12b are the driver output circuit 12 for displaying an image in a time-division drive mode at the gate and source of a TFT 60 of the liquid crystal display 55, respectively. A logic circuit 13 is a circuit comprising various registers or control circuits. A graphic RAM 14 is a circuit for displaying an icon etc. in a static drive mode on the liquid crystal display 55. Further, an input terminal 15 is a circuit comprising an input/output buffer circuit for input/output signal etc. In the protective element forming region 19, a protective element for protecting the driver output circuit 12 against the positive/negative surge (electrostatic breakdown) is formed. As will be described later, a pn junction diode is applied as the protective element.

The pad 16 is configured to output the address signal from the gate driver 12a of the driver output circuit and is electrically connected to the gate driver 12a via an interconnect wire (not shown). In addition, the pad 16 is configured to output the data signal from the source driver 12b of the driver output circuit 12 and is electrically connected to the source driver 12b via an interconnect wire (not shown). Further, the pad 17 is configured to input, via the heat seal 53, the signal output from the microcomputer over the printed circuit board 54 shown in FIG. 1.

Figure 2:
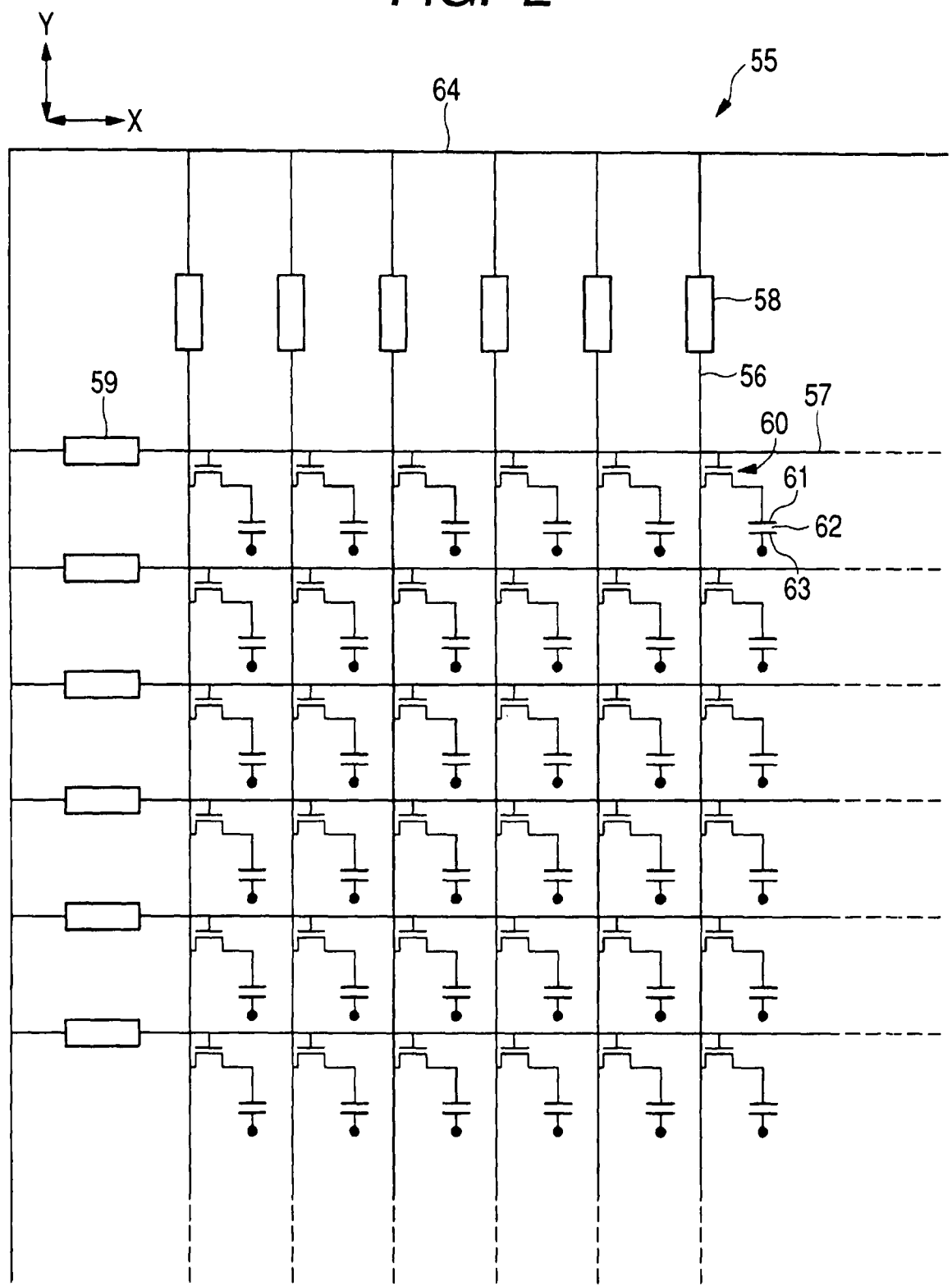
FIG. 2 is a diagram for illustrating a circuit system of a liquid crystal display to which the LCD driver the present inventors are examining is applied.
Figure 3:
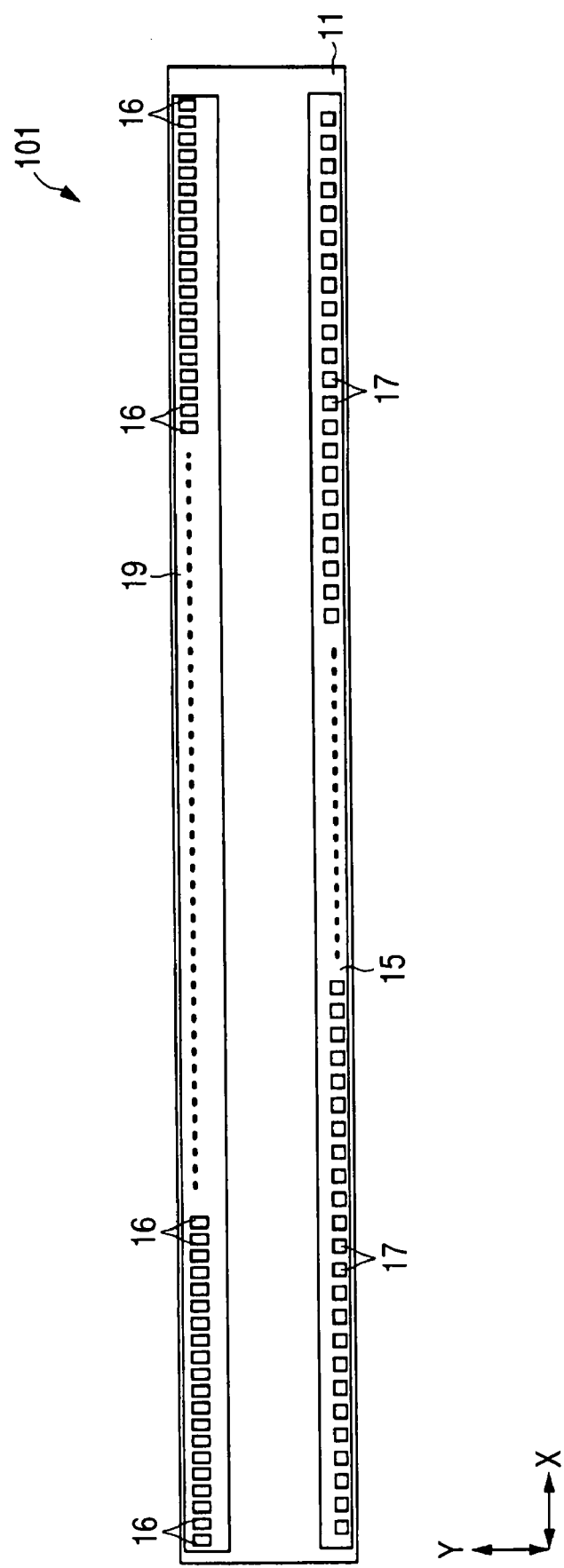
FIG. 3 is a diagram for illustrating the LCD driver the present inventors are examining and the layout of pads formed over the LCD driver.

For example, in the liquid crystal display 55 in FIG. 2, when the resolution is the QQVGA (160×120 pixels), 160 of the gate lines 57 and the 120×3 (RGB) of the source lines 56, that is, 520 lines in total are required, and 160 of the pads 16 and 360 of pads 16b, respectively, are also required accordingly. As described above, when the sides of the LCD driver 101 are to be shortened, since it is desirable not to place the pads for the driver output circuit 12 on both sides along the Y direction, all of the pads 16 are placed, as a result, on one side in the X direction of the semiconductor chip 11 as shown in FIG. 8.

Figure 9:
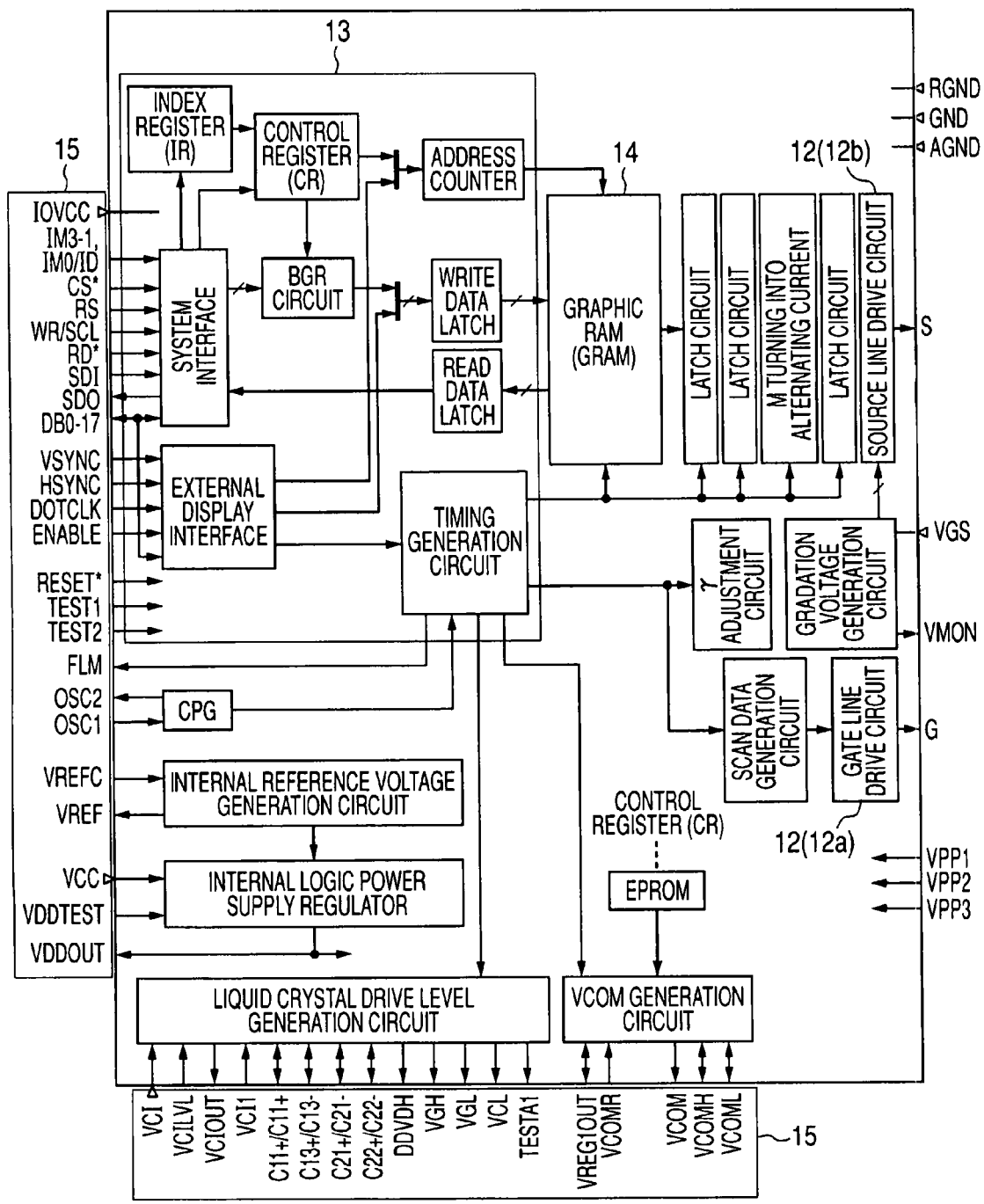
FIG. 9 is a circuit block diagram of the LCD driver in FIG. 8.

FIG. 9 is a circuit block diagram of the LCD driver circuit 1 in FIG. 8. The circuit of the LCD driver 1 comprises the gate driver 12a, the source driver 12b, the logic circuit 13, the graphic RAM 14, the input terminal 15, etc.

Figure 10:
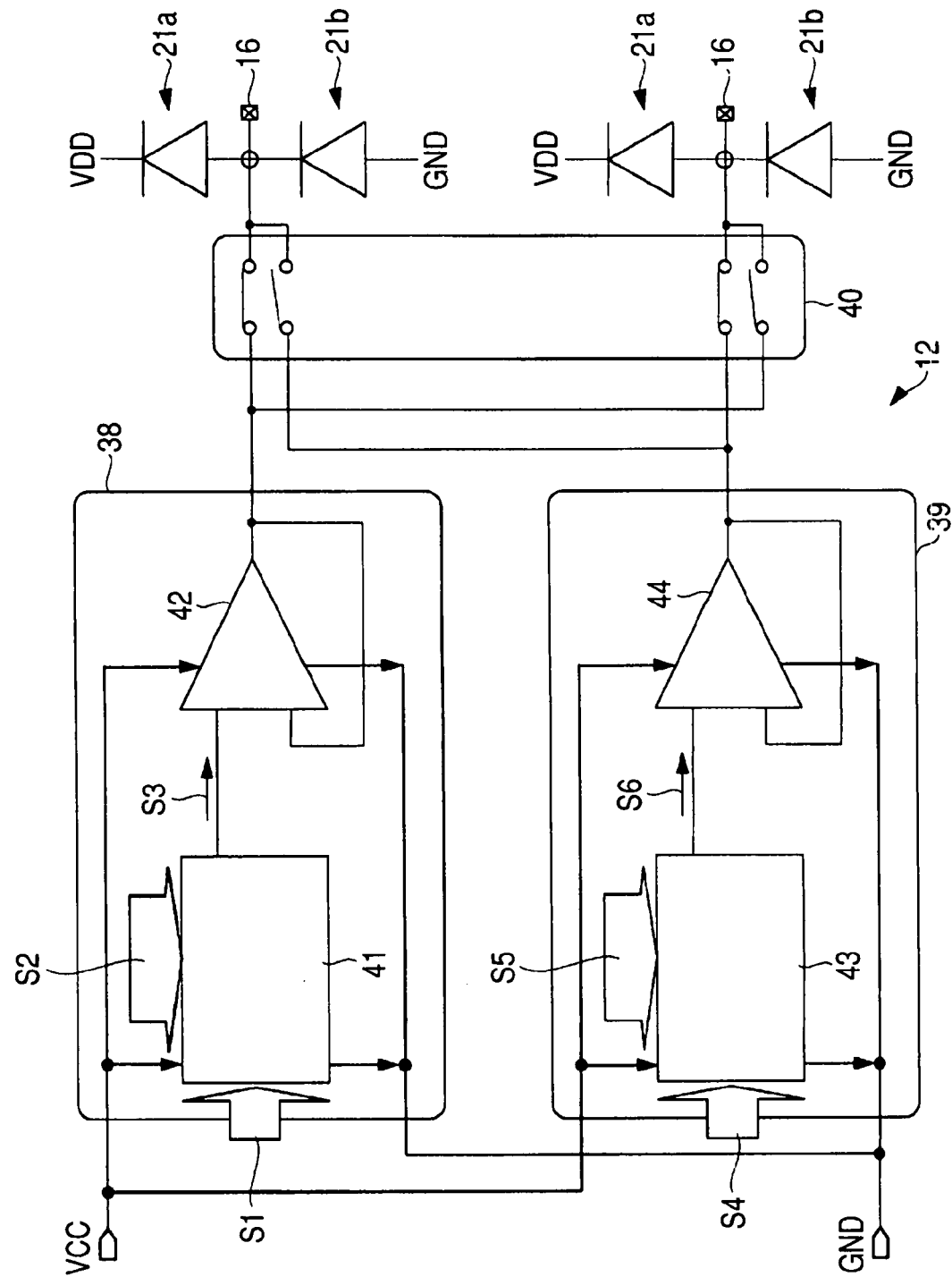
FIG. 10 is a diagram for illustrating connection between a driver output circuit of the LCD driver in FIG. 8 and a protective element.

FIG. 10 is a diagram for illustrating the relationship between the protective elements 21a, 21b and the driver output circuit 12.

The driver output circuit 12 uses an alternating current signal as an output signal, the polarity of which changes between positive and negative, in order to prevent immobilization of the liquid crystal constituting the pixel due to an imbalance of the positive or negative charges accumulated in one side on the electrode surface. Therefore, the driver output circuit 12 has a positive electrode output circuit 41, a negative electrode output circuit 42, and a switch 43 for turning output into alternating current.

The positive electrode output circuit 41 has a positive electrode level selection decoder circuit 44 and a positive electrode level output amplifier 45 and both are connected to a power supply potential (VCC) and a reference potential (GND). A certain selection level (S3) from the positive electrode level selection decoder circuit 44, to which a selection signal (S1) and a positive electrode reference level (S2) have been input, is amplified in the positive electrode level output amplifier 45 and output to the switch 43 for turning output into alternating current. In addition, the negative electrode output circuit 42 has a negative electrode level selection decoder 46 and a negative electrode level output amplifier 47 and both are connected with the power supply potential (VCC) and the reference potential (GND). A certain selection level (S6) from the negative electrode level selection decoder circuit 46, to which a selection signal (S4) and a negative electrode reference level (S5) have been input, is amplified in the positive electrode level output amplifier 47 and output to the switch 43 for turning output into alternating current.

Between the pad 16 and the driver output circuit 12, the anode of the diode which is the protective element 21a, and the cathode of the diode which is the protective element 21b, are placed to connect them to pad 16 and driver circuit 12, and the cathode of the diode which is the protective element 21a, is connected with the power supply potential (VCC) and the anode of the diode which is the protective element 21b, is connected with the reference potential (GND). With this configuration, the protective elements 21a, 21b serve as a protective element to prevent the driver output circuit 12 from an electrostatic breakdown by the positive or negative surge from the pad 16. In addition, either in the case that the driver output circuit 12 is the gate driver 12a or that it is the source driver 12b, the protective elements 21a, 21b serve as a protective element to prevent an electrostatic breakdown by the position/negative surge from the pad 16.

As described above, the protective elements 21a, 21b are necessary between the pad 16 and the driver output circuit 12 in order to protect the driver output circuit 12 against an electrostatic breakdown. As shown in FIG. 8, the pads 16 are placed over the outer circumference of the surface of the semiconductor chip 11 and the protective elements 21a, 21b, not shown in the figure, are formed in the protective element forming region 19 under the pads 16.

Figure 11:
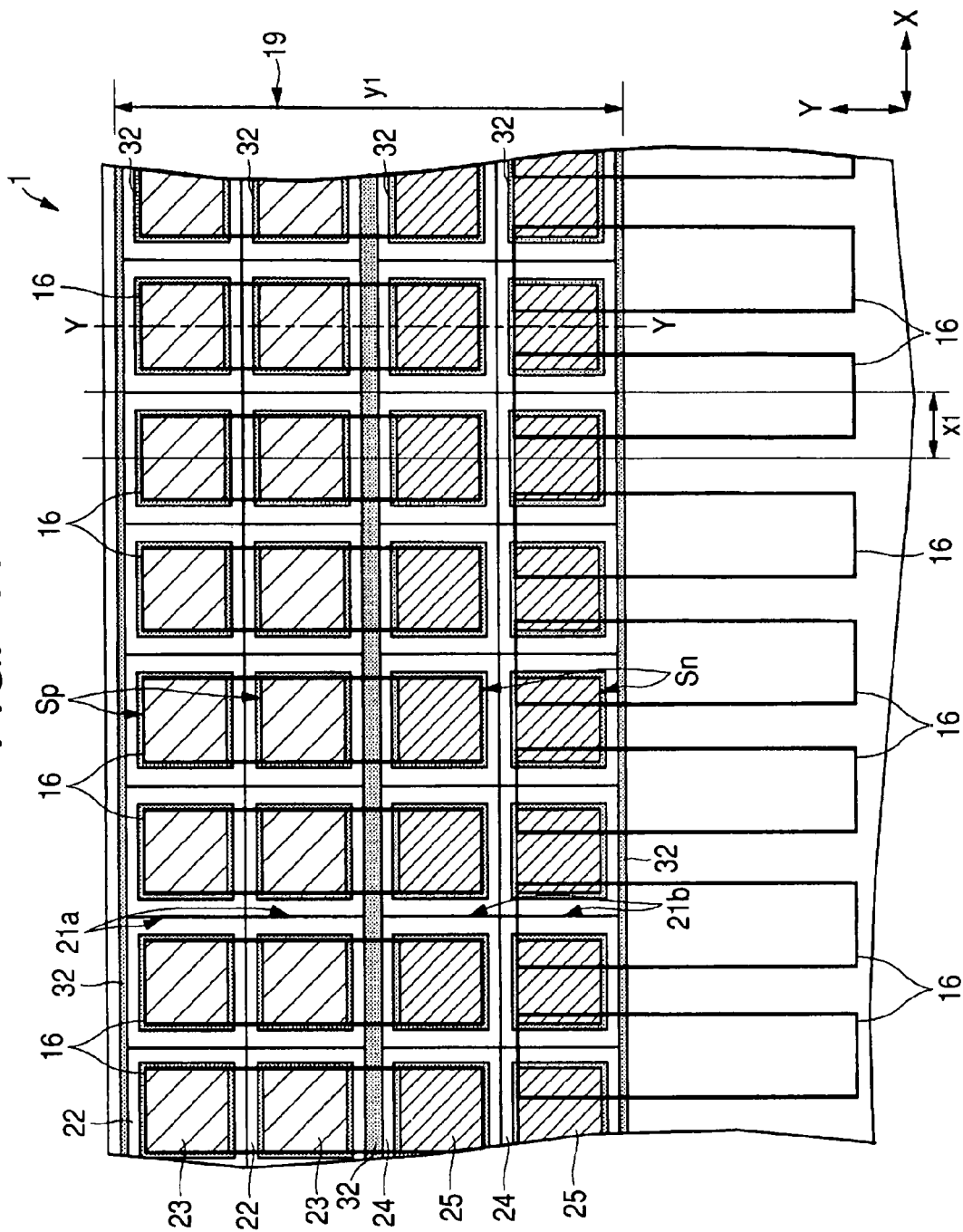
FIG. 11 is a plan view schematically showing the critical parts of the LCD driver in FIG. 8.
Figure 12:
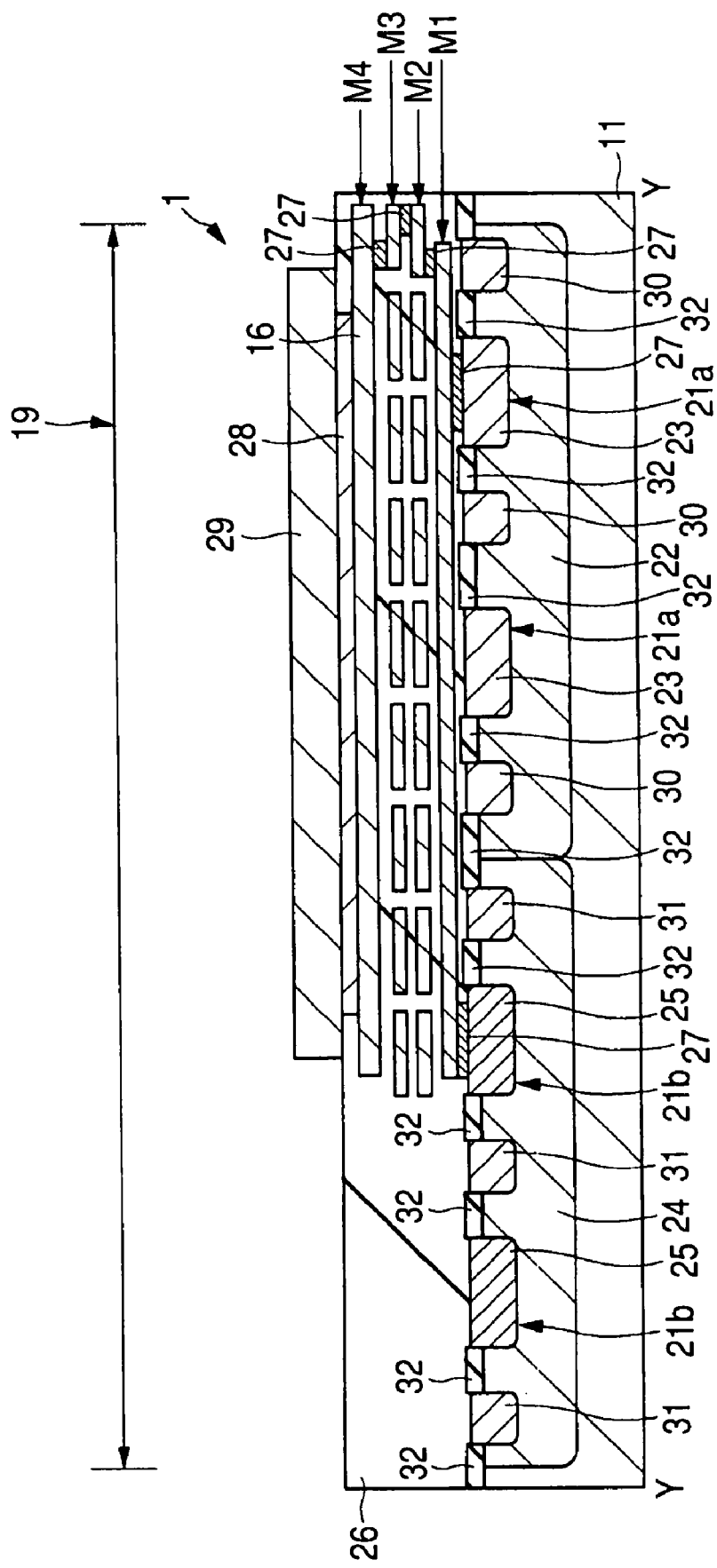
FIG. 12 is a sectional view along Y-Y line in FIG. 11.
Figure 13:
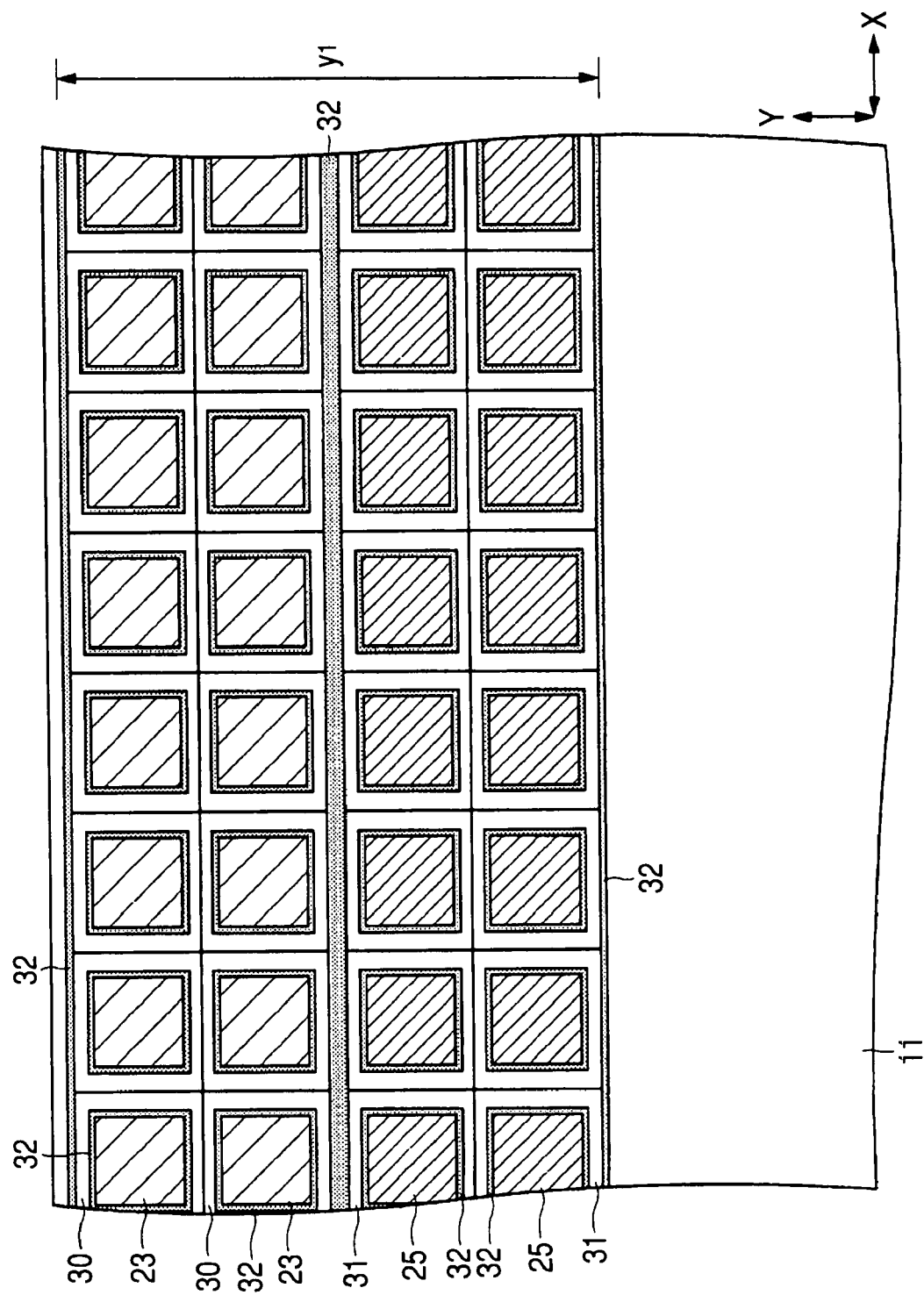
FIG. 13 is a plan view schematically showing the main surface of a semiconductor substrate in FIG. 11.

FIG. 11 is a plan view schematically showing critical parts of the LCD driver 1 in the first embodiment 1. FIG. 12 is a sectional view by the Y-Y line in FIG. 11. FIG. 13 is a plan view schematically showing the main surface of the semiconductor chip 11 in FIG. 11, and FIGS. 14 to 17 are plan views schematically showing the main surfaces of the first wiring layer M1 to the fourth wiring layer M4, respectively.

In FIG. 11, for easier understanding, the protective elements 21a, 21b and the pads 16 in a see-through state, formed over the main surface of the semiconductor chip 11 are shown. The protective element area Sp of the protective element 21a, the protective element area Sn of the protective element 21b, and the isolation part 32 are hatched. In addition, though not shown, between the pad 16 and the driver output circuit 12 (the gate driver 12a, the source driver 12b), the protective elements 21 (the protective elements 21a, 21b) are connected as described above.

In the first embodiment of the present invention, a pair of diodes associated with one pad 16, that is, the two protective elements 21a, 21b for one output are formed over the main surface of the semiconductor chip 11, in order to protect the driver output circuit 12 against an electrostatic breakdown by the positive/negative surge. Further, the protective element 21a and the protective element 21b are laid out in twos, respectively, on the same straight line in the Y direction and further, are laid out adjacent to each other in the X direction. In addition, the pads 16 are laid out in a staggered form over the protective element 21a or the protective element 21b. In FIG. 11, a pitch (x1) between the pads 16 neighboring in the X direction of the LCD driver 1 is shown. In addition, a size (y1) of the protective element forming region 19 in the Y direction is shown.

As shown in FIG. 11 and FIG. 12, two p-type semiconductor regions 23 are formed in one n-type semiconductor region 22 (n-type well). In other words, the protective elements 21a are pn junction diodes comprising the n-type semiconductor region 22 formed over the main surface of the semiconductor chip 11 composed of a p-type single crystal silicon, and the p-type semiconductor regions 23 formed in the n-type semiconductor region 22, and therefore, two diodes are formed in one n-type semiconductor region 22.

In addition, as shown in FIG. 11 and FIG. 12, two n-type semiconductor regions 25 are formed in one p-type semiconductor region 24 (p-type well). In other words, the protective elements 21b are pn junction diodes comprising the p-type semiconductor region 24 formed over the main surface of the semiconductor chip 11 and the n-type semiconductor regions 25 formed in the p-type semiconductor region 24, and therefore, two diodes are formed in one p-type semiconductor region 24.

Figure 4:
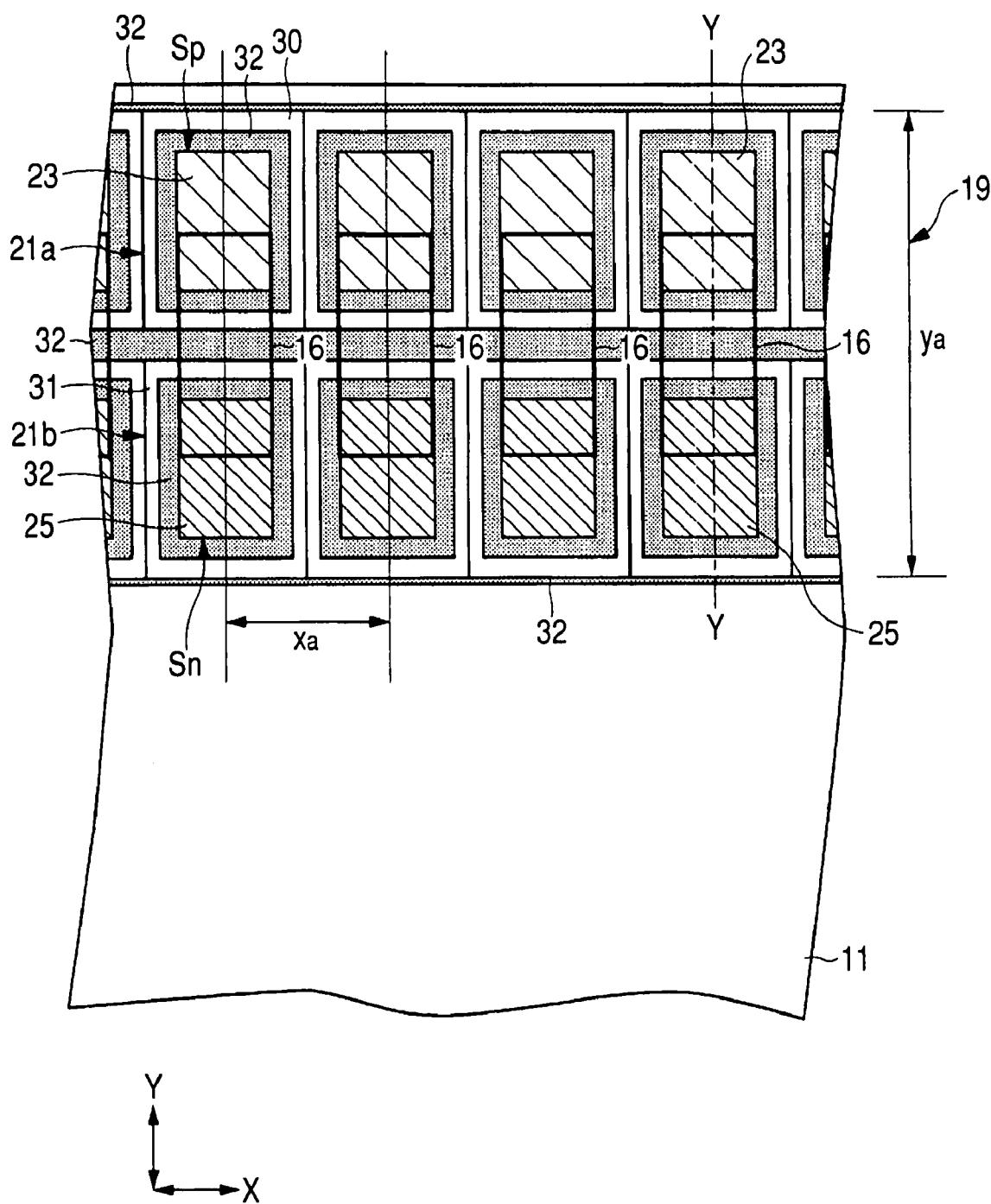
FIG. 4 is a plan view schematically showing the critical parts of the LCD driver in FIG. 3.
Figure 5:
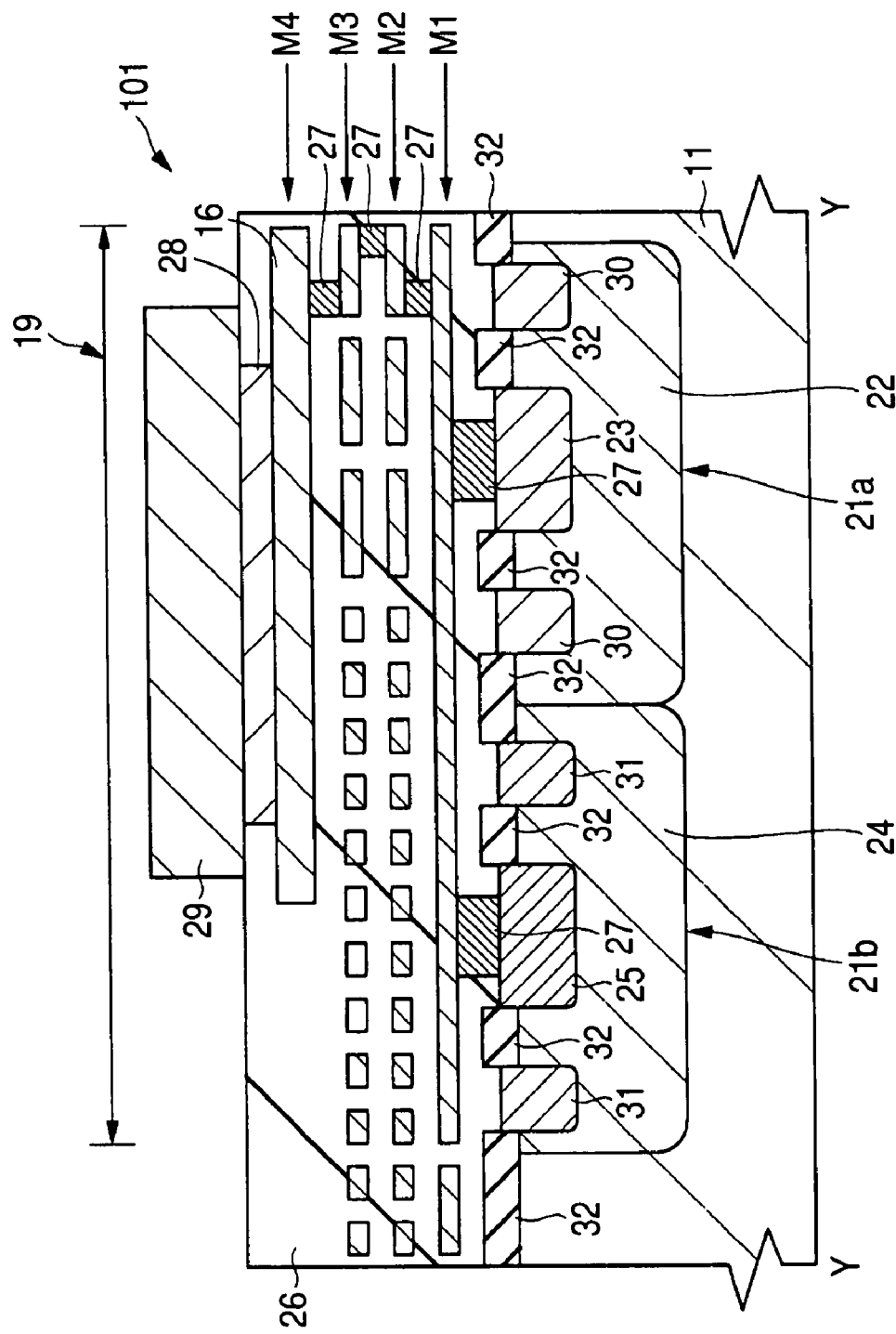
FIG. 5 is a sectional view along Y-Y line in FIG. 4.

Because of this, what differs from the LCD driver 101 (refer to FIG. 4 and FIG. 5) the inventors of the present invention have examined, lies in that plural (two) p-type semiconductor regions 23 (or n-type semiconductor regions 25) are formed in one n-type semiconductor region 22 (or p-type semiconductor region 24).

As shown in FIG. 12 and FIG. 13, the protective element 21a comprises the n-type semiconductor region 22 formed over the main surface of the semiconductor chip 11 composed of, for example, a p-type single crystal silicon substrate and the p-type semiconductor region 23 formed in the n-type semiconductor region 22. In addition, the protective element 21b comprises the p-type semiconductor region 24 formed over the main surface of the semiconductor chip 11 and the n-type semiconductor region 25 formed in the p-type semiconductor region 24. The protective elements 21a, 21b are protective elements to protect the driver output circuit against an electrostatic breakdown by the positive/negative surge.

Figure 14:
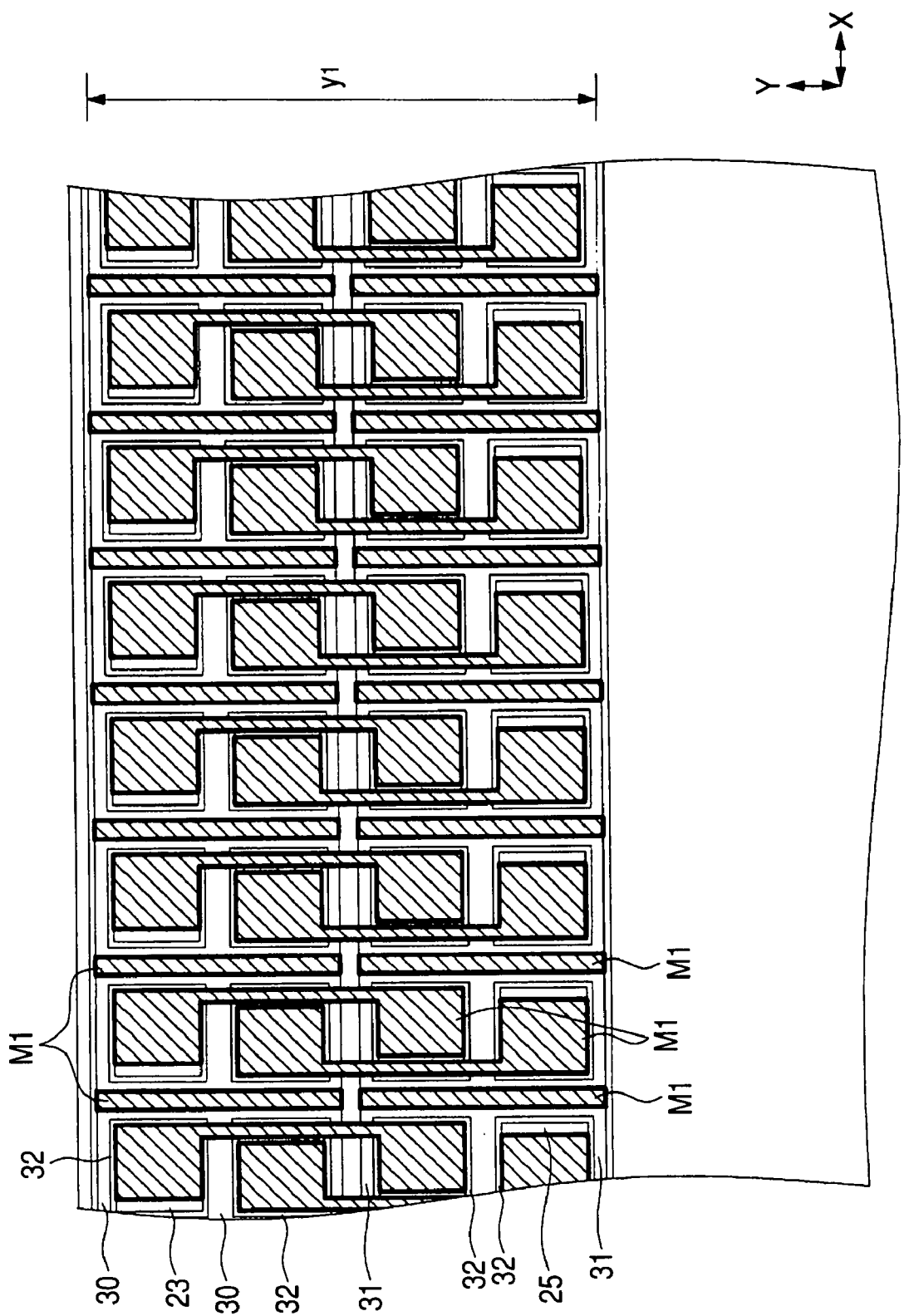
FIG. 14 is a plan view schematically showing the top surface of a first wiring layer in FIG. 11.

Over the protective elements 21a, 21b, a multilayer interconnect wiring is formed. The four-layer wiring layers M1 to M4 formed in an interlayer insulating film 26 are shown. As shown in FIG. 12 and FIG. 14, the p-type semiconductor region 23 of the protective element 21a (anode of the diode constituting the protective element 21a) and the n-type semiconductor region 25 of the protective element 21b (cathode of the diode constituting the protective element 21b) are connected by the first wiring layer M1 via the contact 27. In other words, the p-type semiconductor region 23 of the protective element 21a, which is the protective element 21, and the n-type semiconductor region 25 of the protective element 21b, which is the protective element 21, are connected electrically to each other. Over the protective element 21a or the protective element 21b, which are the protective element 21, the pads 16 are laid out as shown in FIG. 11.

Figure 15:
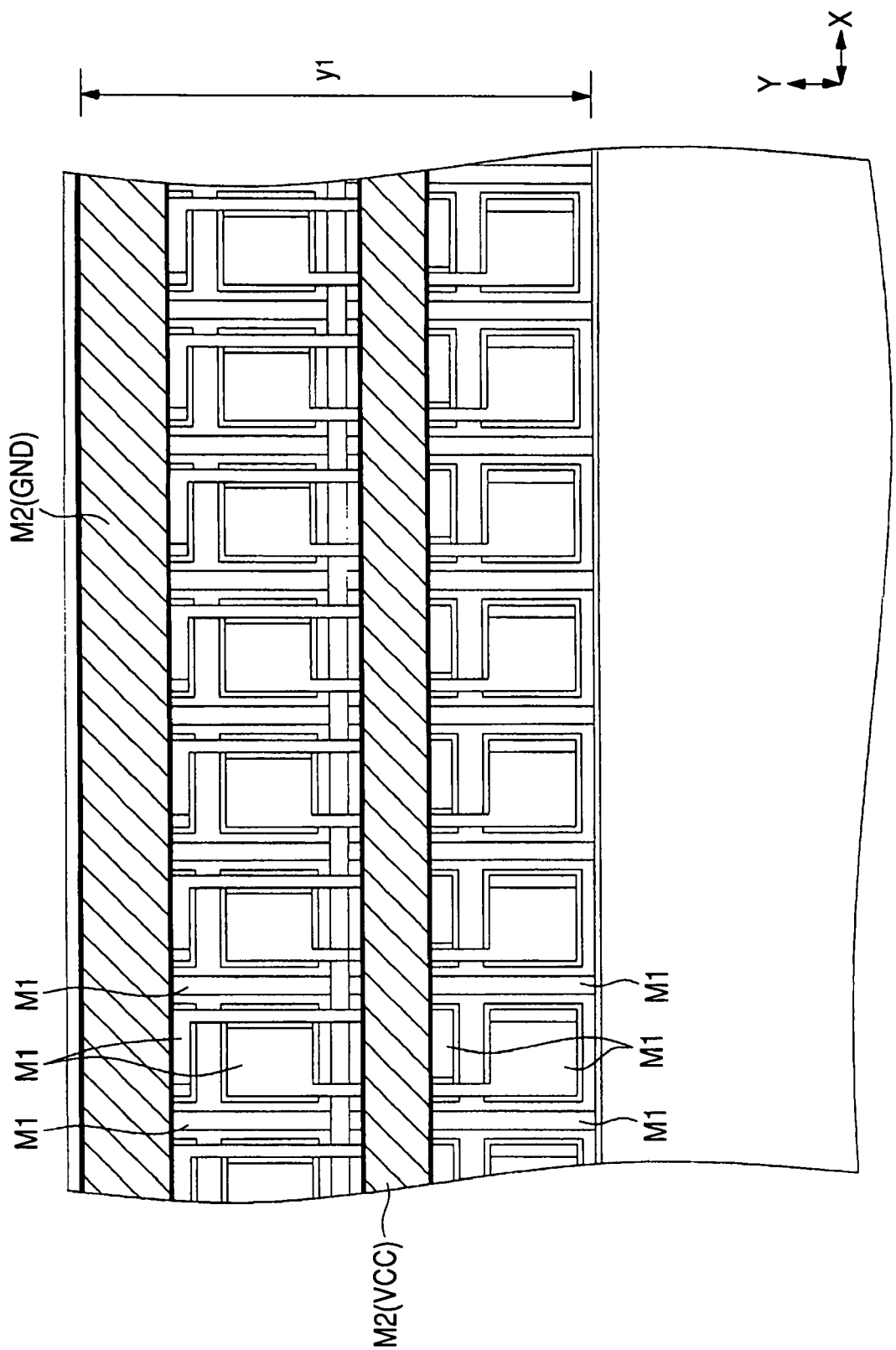
FIG. 15 is a plan view schematically showing the top surface of a second wiring layer in FIG. 11.
Figure 16:
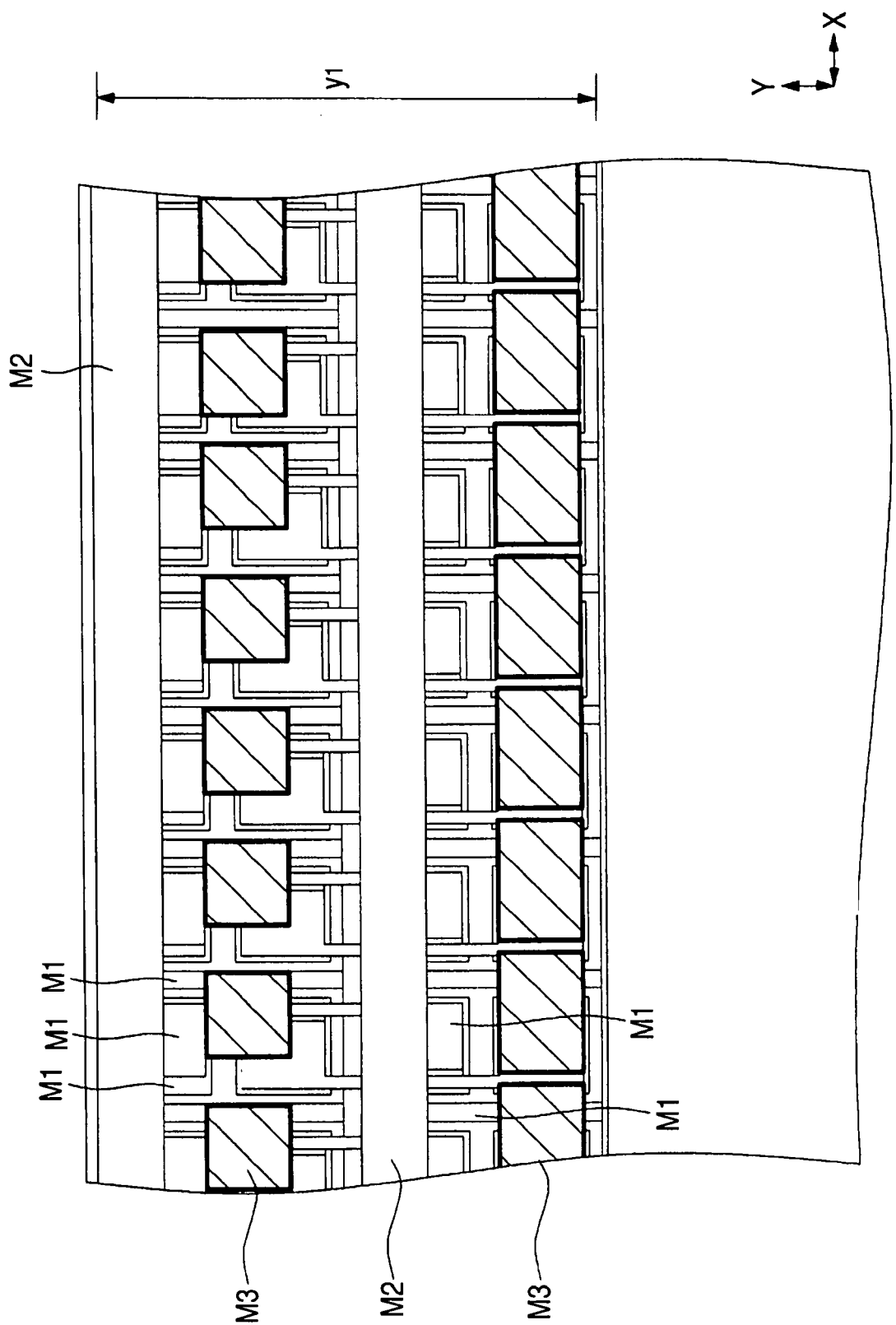
FIG. 16 is a plan view schematically showing the top surface of a third wiring layer in FIG. 11.

Further, as shown in FIG. 12 and FIG. 15, the first wiring layer M1 and the second wiring layer M2 are connected via the contact 27. The second wiring layer M2 serves as supply wire for the power supply potential (VCC) and the reference potential (GND). In addition, as shown in FIG. 12 and FIG. 16, the second wiring layer M2 and the third wiring layer M3 are connected via the contact 27.

Figure 17:
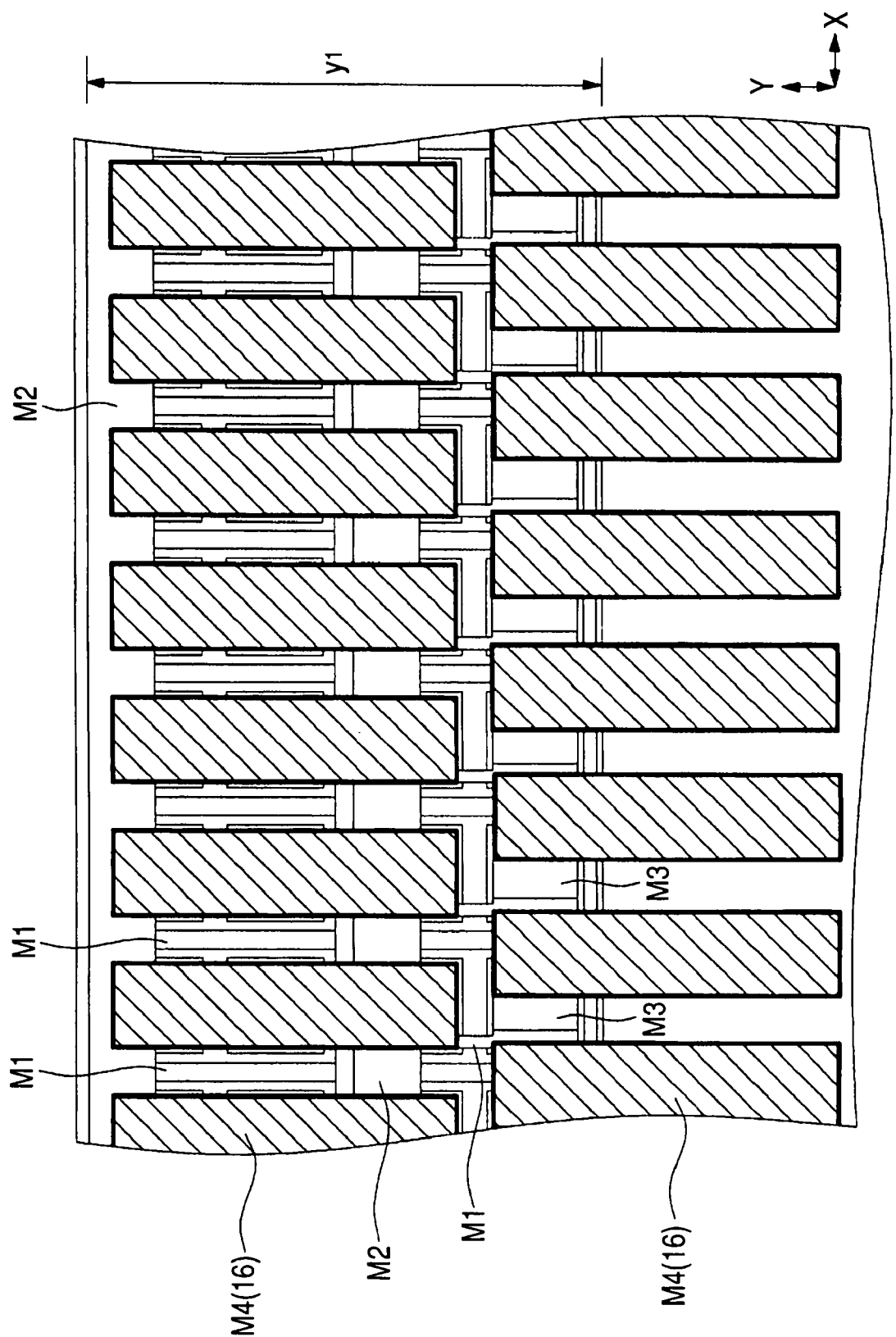
FIG. 17 is a plan view schematically showing the top surface of a fourth wiring layer in FIG. 11.

In addition, as shown in FIG. 12 and FIG. 17, the third wiring layer M3 is connected to the fourth wiring layer via the contact 27. The fourth wiring layer M4 constitutes the pad 16. Over the pad 16, the bump 29, which is an external electrode, is formed via the under-bump electrode 28.

In the LCD driver 1 with such a structure, the p-type semiconductor region 23 of the protective element 21a and the n-type semiconductor region 25 of the protective element 21b are connected electrically. In other words, the anode of the diode, which is the protective element 21a, the cathode of the diode of the protective element 21b, and the pad 16 are connected electrically. Further, the p-type semiconductor region 23 and the n-type semiconductor region 25 are electrically connected with the output of the driver output circuit 12. Consequently, between the pad 16 and the driver output circuit 12 (the gate driver 12a, the source driver 12b), the protective elements 21a, 21b are connected.

Further, in the n-type semiconductor region 22, an n-type semiconductor region 30 is formed and led out by a contact (not shown) as the cathode of the diode, which is the protective element 21a. In addition, in the p-type semiconductor region 24, the p-type semiconductor region 31 is formed and led out by a contact (not shown) as the anode of the diode, which is the protective element 21b.

Furthermore, over the main surface of the semiconductor chip 11, the isolation part 32 is formed. The isolation part 32 is a part in which, for example, a LOCOS (Local oxidation of silicon) is formed. In addition, the isolation part 32 can be formed using an isolation region of groove type called an SGI (Shallow Groove Isolation) or an STI (Shallow Trench Isolation). The STI is formed by depositing insulation films, such as an oxide film, a nitride film, etc., in a groove formed in a semiconductor substrate.

Here, when the resolution of the liquid crystal display 55 is enhanced, for example, from the QQVGA to the QVGA with a higher definition, the number of outputs of the driver output circuit 12 increases, that is, the number of pads 16 increases. In this case, in order to suppress the increase in chip size, it is necessary to narrow the pitch between the neighboring pads 16.

In addition, as described above, it is necessary to place a pair of the protective elements 21a, 21b between the pad 16 and the driver output circuit 12 for one pad 16 in order to protect the driver output circuit 12 from an electrostatic breakdown. Because of this, when the number of outputs of the driver output circuit 12 increases, the number of protective elements 21a, 21b also increases in accordance with the increase in the number of pads 16, and the protective element forming region 19 also extends according to the amount of the increase. In other words, in the protective elements 21a, 21b, a certain area must be preserved for the protective element areas Sp, Sn in order to ensure an electrostatic withstand voltage, and therefore, as the number of pads 16 increases, the total area of the protective element areas Sp, Sn increase, and the protective element forming region 19 extends according to the amount of the increase.

Figure 1:
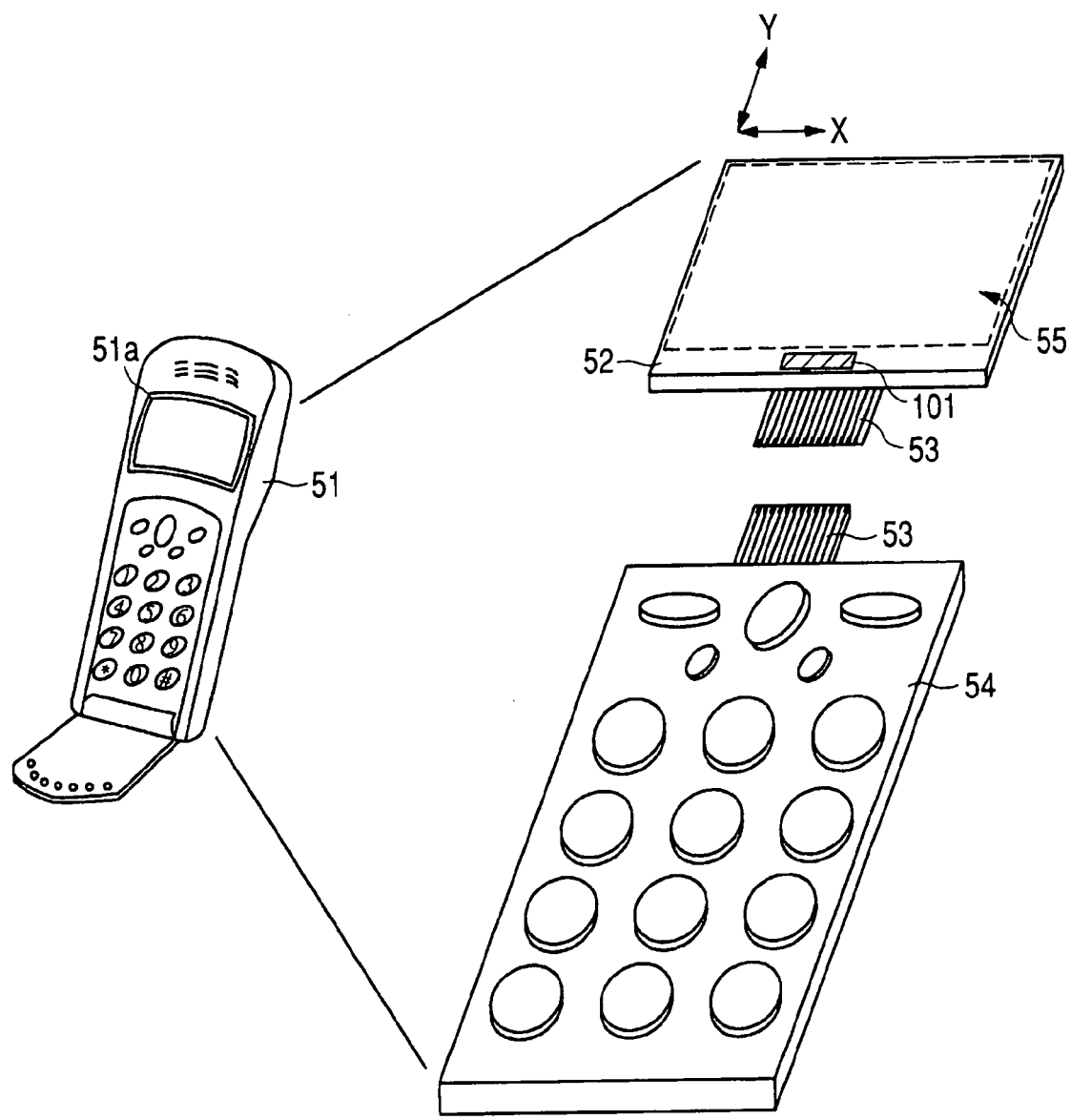
FIG. 1 is a diagram for illustrating a mobile phone with an LCD driver the present inventors are examining.

Further, when the screen size of the liquid crystal display 55 of the mobile phone 51 shown in FIG. 1 and FIG. 2 is increased in the direction of the gate line 57 and in the direction of the source line 56, it is necessary to reduce in size the LCD driver 1 to be mounted on the glass substrate 52 constituting the screen. In particular, it is effective to shorten the length in the direction of the short side of the LCD driver 1 along the screen of the liquid crystal display 55 more than that in its lengthwise direction.

Consequently, in order to suppress the increase in chip size and to shorten the length in the direction of the short side of the LCD driver 1 more than the other to cope with the increase in the number of outputs of the driver output circuit 12, it is necessary to narrow the pitch between the pads 16 and reduce in size the protective element forming region 19 in the Y direction.

Because of this, in the LCD driver 1 in the first embodiment of the present invention, diodes are applied as the protective element 21a and the protective element 21b, the anode of the diode constituting the protective element 21a and the diode constituting the protective element 21b are connected electrically, and such connection is connected to the pad 16 placed over the protective element 21a or the protective element 21b, and the output of the driver output circuit 12. In other words, the two protective elements 21a, 21b are arranged for one output (one pad 16).

Further, as shown in FIG. 11, the protective element 21a and the protective element 21b are laid out in twos, respectively, on the same straight line in the Y direction of the protective element forming region 19 and further, the protective elements 21a and the protective elements 21b laid out in twos, respectively, in the Y direction are laid out adjacent to each other in the X direction. In addition, the pads 16 are laid out in a staggered form over the protective element 21a or the protective element 21b.

Figure 7:
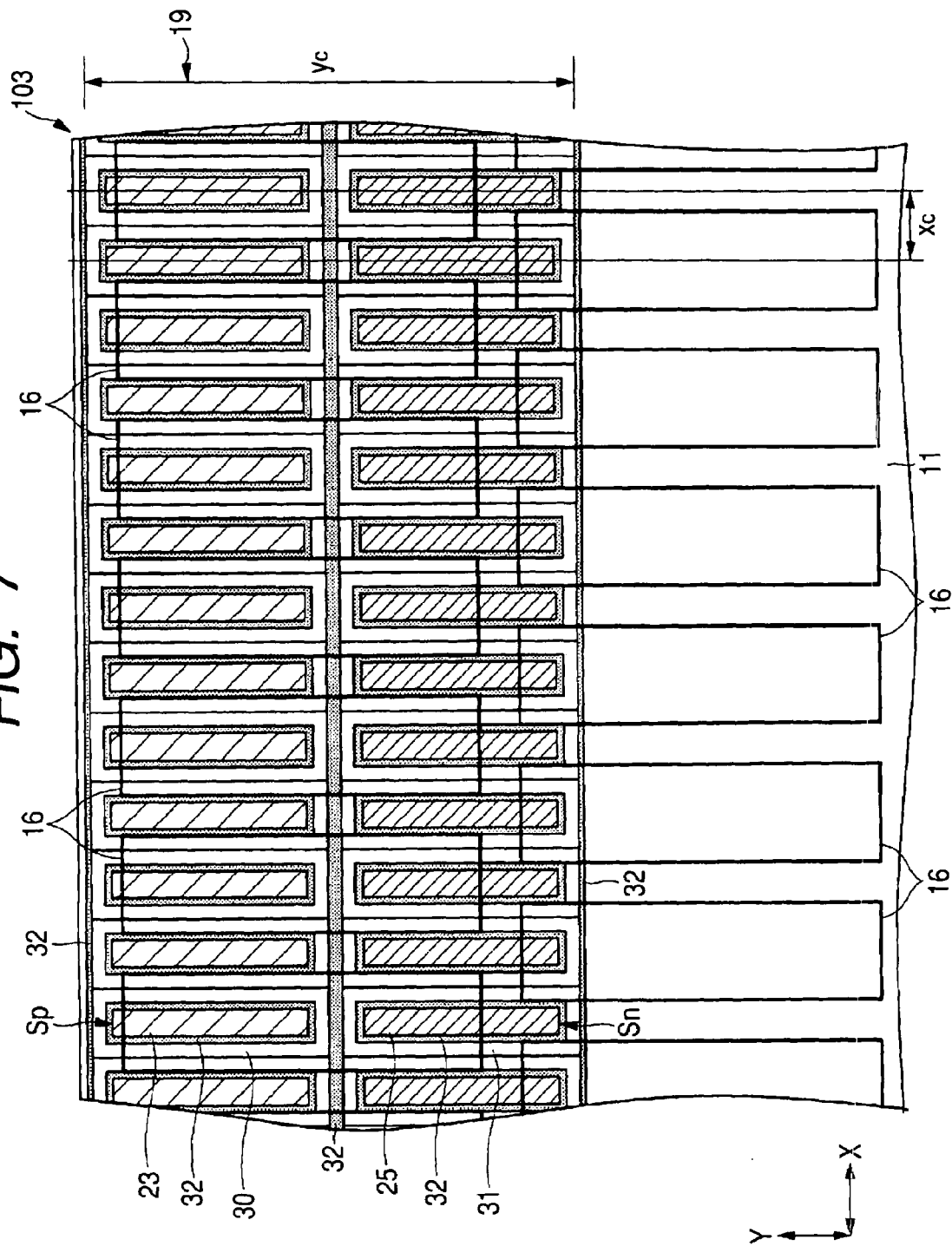
FIG. 7 is a plan view schematically showing the critical parts of another example of the LCD driver the present inventors are examining to cope with the increase in the number of outputs.

Consequently, it is possible to distribute the amount of increase in the number of protective elements 21a, 21b according to the increase in the number of outputs, in the two-axis directions (X directions) instead of the one-axis direction as illustrated, for example, in FIG. 7, where the size of the protective element forming region 19 in the Y direction is yc. Because of this, the size (y1) in the Y direction of the protective element forming region 19 in FIG. 11 becomes smaller than the size (yc) of that in FIG. 7 and it is possible to reduce the chip size as much as possible in accordance with the demand from the LCD driver 1 to shorten the length in the direction of the short side (Y direction) more than that in the lengthwise direction (X direction).

As described above, in the first embodiment of the present invention, it is possible to reduce the chip size of the LCD driver 1 as much as possible. Due to this, it is possible to increase the number of chips to be obtained.

In addition, it is possible to make the length in the direction of the short side of the LCD driver 1 shorter. Due to this, it is possible to extend the screen size of the liquid crystal display 55 in the direction of the source line. Further, since it is possible to make the length in the direction of the short side of the LCD driver 1 shorter, it is also possible to reduce the frame 51a that covers the periphery of the liquid crystal display 55 (the region in which the LCD driver 1 is mounted).

Second Embodiment

A second embodiment of the present invention differs from the above-mentioned first embodiment 1 particularly in the layout of the pads formed over the semiconductor chip. The difference from the above-mentioned first embodiment is mainly described below.

Figure 18:
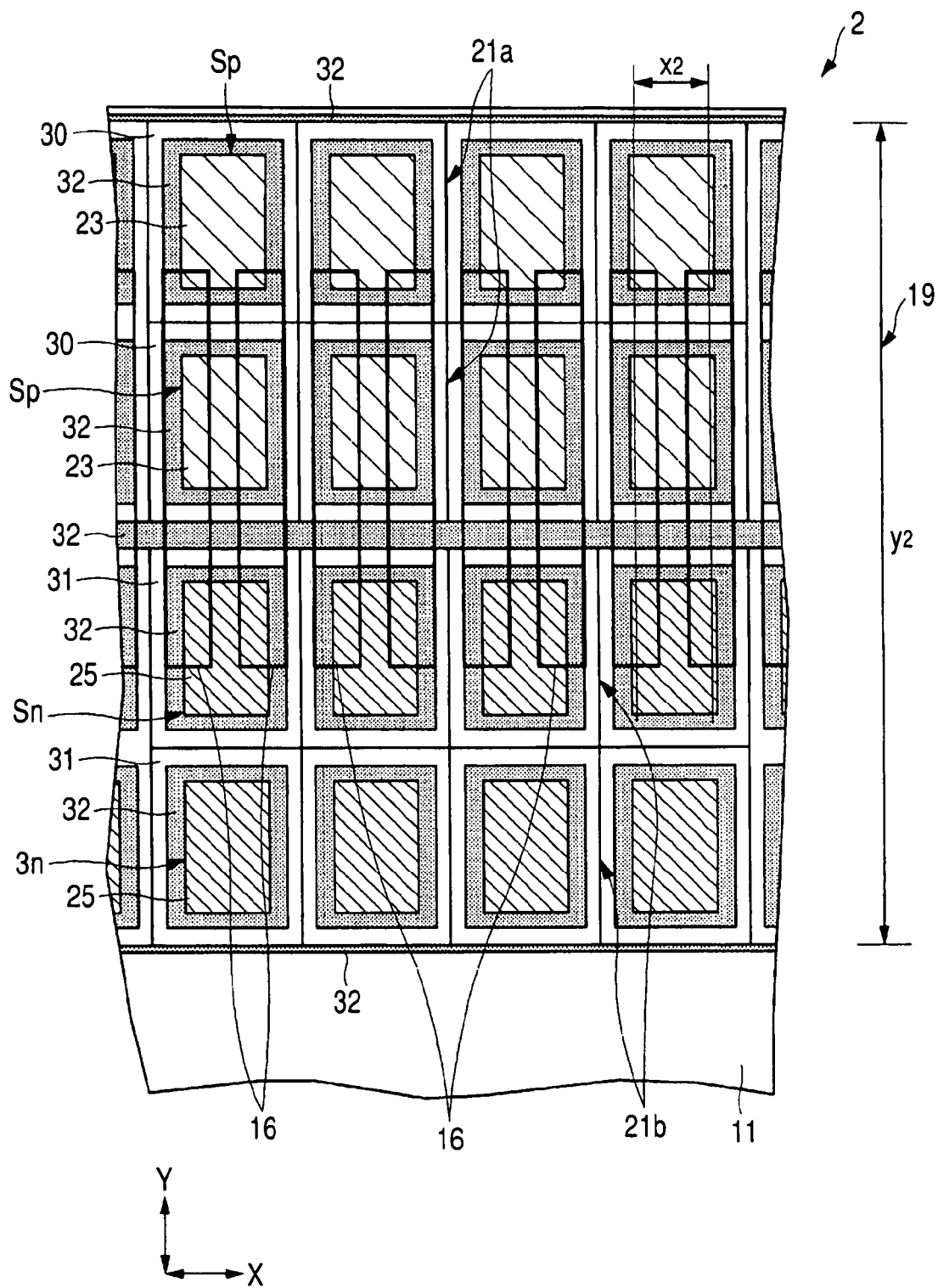
FIG. 18 is a plan view schematically showing the critical part of an LCD driver in a second embodiment of the present invention.

FIG. 18 is a plan view schematically showing critical parts of an LCD driver 2 in the second embodiment of the present invention. For easier understanding, the protective elements 21a, 21b and the pads 16 in a see-through state, formed over the main surface of the semiconductor chip hare shown, and further, the protective element area Sp of the protective element 21a, the protective element area Sn of the protective element 21b, and the isolation part 32 are hatched. Moreover, a pitch (x2) between the pads 16 neighboring in the X direction of the LCD driver 2 is shown. A size (y2) in the Y direction of the protective element forming region 19 is also shown. Furthermore, plural (two) p-type semiconductor regions 23 (or n-type semiconductor regions 25) are formed in one n-type semiconductor region 22 (or p-type semiconductor region 24).

As described in the above-mentioned first embodiment, the protective elements 21a, 21b are electrically connected between the pad 16 and the driver output circuit. The pads 16 are laid out on the same straight line in the X direction over the protective element 21a or the protective element 21b.

For the pad 16, a pair of diodes associated with one pad 16, that is, the two protective elements 21a, 21b for one output are formed over the main surface of the semiconductor chip 11 in order to protect the driver output circuit against an electrostatic breakdown by the positive/negative surge. The protective element 21a and the protective element 21b are arranged in twos, respectively, that is, a total of four protective elements are laid out on the same straight line in the Y direction and further, they are laid out adjacent to each other in the X direction.

As described in the above-mentioned first embodiment, in order to suppress the increase in chip size and to make the length in the direction of the short side of the LCD driver 2 shorter, to cope with the increase in the number of outputs of the driver output circuit 12, it is necessary to narrow the pitch between the pads 16 and reduce in size the protective element forming region 19 in the Y direction.

Figure 6:
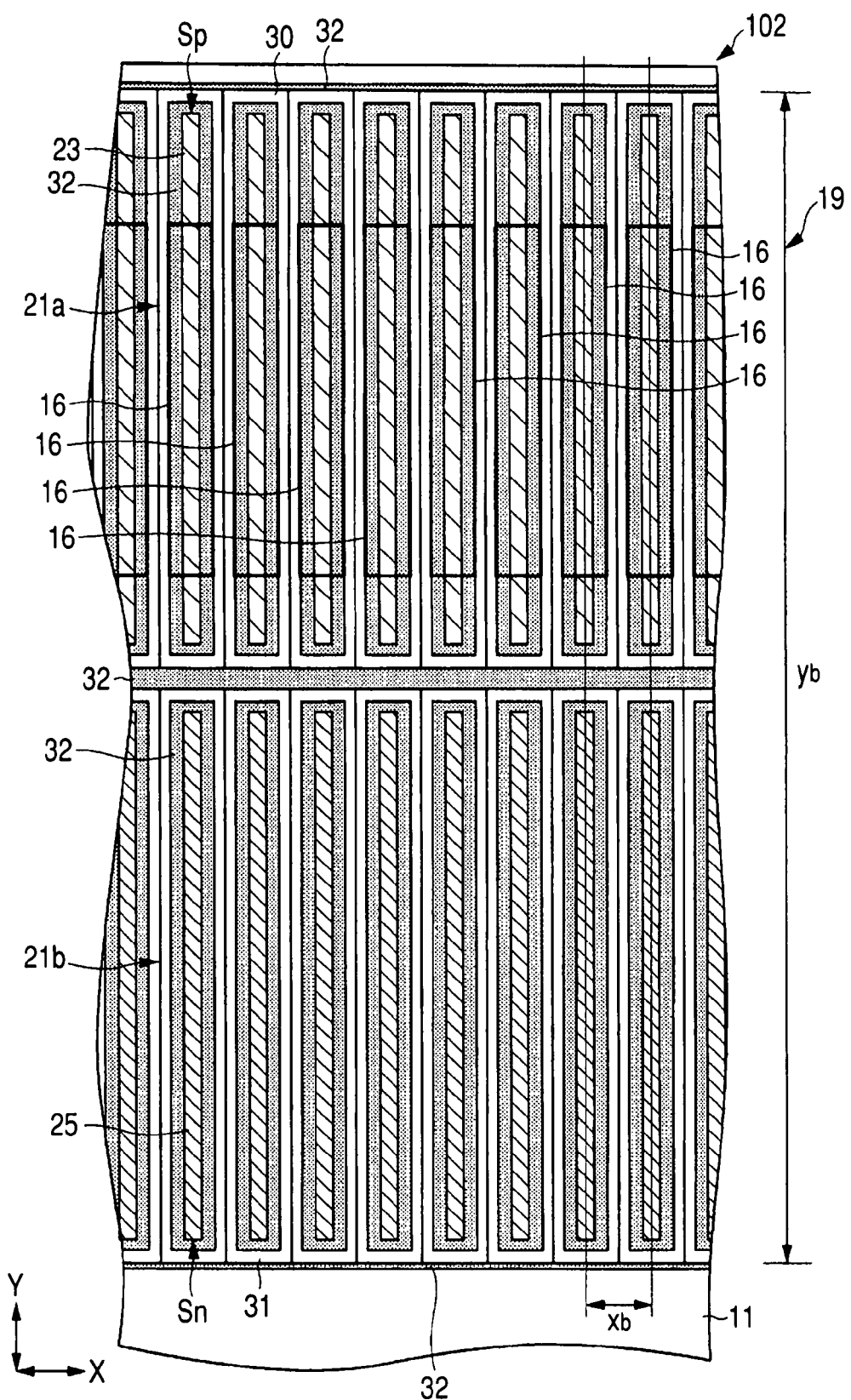
FIG. 6 is a plan view schematically showing the critical parts of an example of the LCD driver the present inventors are examining to cope with an increase in the number of outputs.

Because of this, in the second embodiment of the present invention, the protective element 21a and the protective element 21b are laid out in twos, respectively, on the same straight line in the Y direction of the protective element forming region 19 and two pads are laid out over the regions of the two protective elements 21a and the two protective elements 21b. In other words, the amount of increase in the number of protective elements 21a, 21b according to the increase in the number of outputs, is distributed in the two-axis directions (X directions) instead of the one-axis direction as illustrated, for example, in FIG. 6, where the size of the protective element forming region 19 in the Y direction is yb. Because of this, the size (y2) in the Y direction of the protective element forming region 19 in FIG. 18 becomes smaller than the size (yb) of that in FIG. 6 and it is possible to reduce the chip size as much as possible in accordance with the demand from the LCD driver 2 to shorten the length in the direction of the short side (Y direction) more than that in the lengthwise direction (X direction).

As described above, it is possible to reduce the chip size of the LCD driver 2 as much as possible. Due to this, it is possible to increase the number of chips to be obtained.

Further, it is possible to make the length in the direction of the short side of the LCD driver 2 shorter. Due to this, it is possible to extend the screen size of the liquid crystal display 55 in the direction of the source line. In addition, since it is possible to make the length in the direction of the short side of the LCD driver 2 shorter, it is also possible to reduce the frame 51a that covers the periphery of the liquid crystal display 55 (the region in which the LCD driver 2 is mounted).

Third Embodiment

In the above-mentioned second embodiment, a case is described in which four protective elements for two outputs are arranged in the direction (Y direction) that intersects the direction (X direction) in which pads are placed. In the third embodiment of the present invention, however, a case where six protective elements for three outputs are arranged will be described mainly focusing on the difference from the above-mentioned first embodiment.

Figure 19:
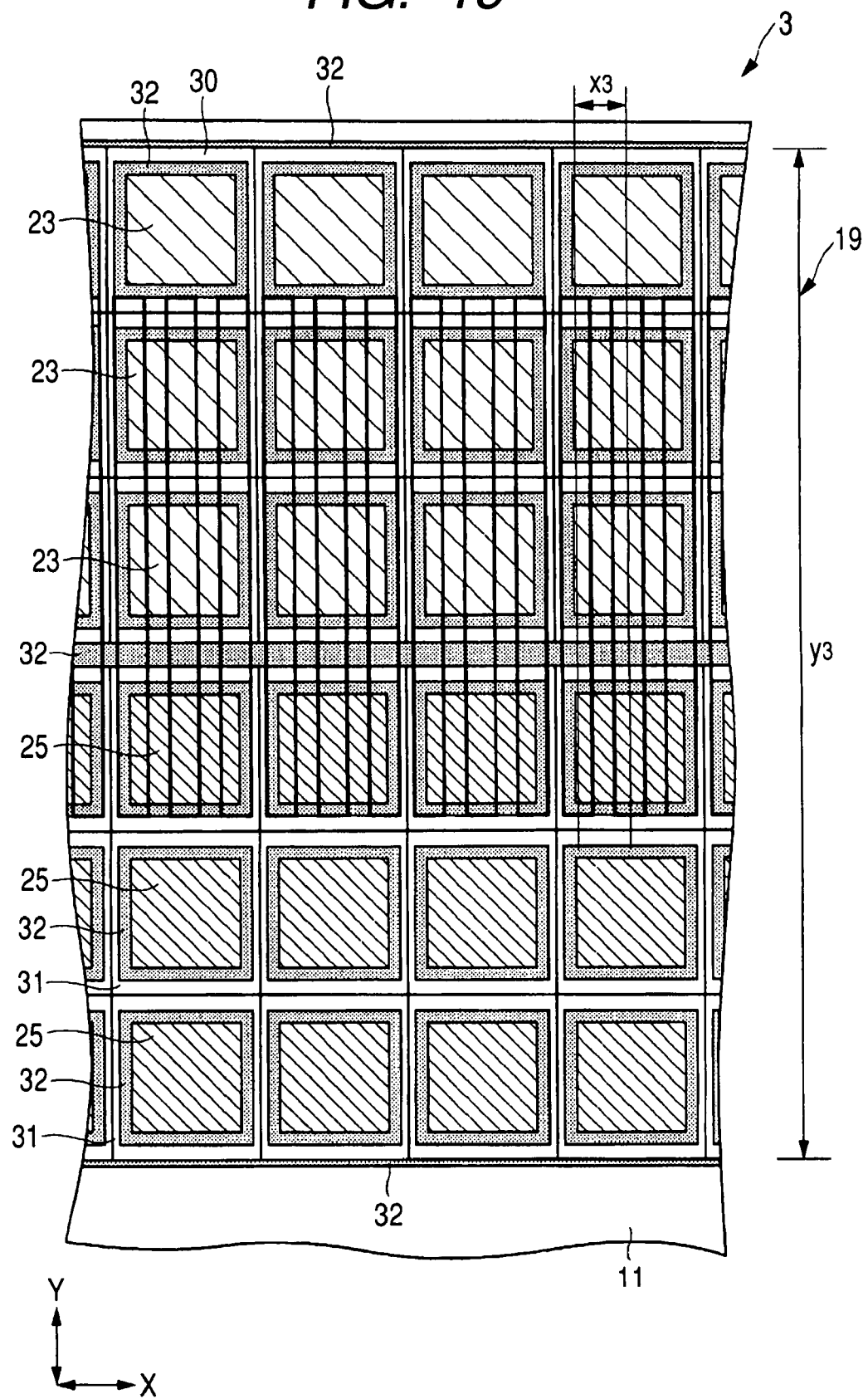
FIG. 19 is a plan view schematically showing the critical part of an LCD driver in a third embodiment of the present invention.

FIG. 19 is a plan view schematically showing critical parts of an LCD driver 3 in the third embodiment of the present invention. For easier understanding, the protective elements 21a, 21b and the pads 16 in a see-through state formed over the main surface of the semiconductor chip 11 are shown. The protective element area Sp of the protective element 21a, the protective element area Sn of the protective element 21b, and the isolation part 32 are hatched. A pitch (x3) between the pads 16 neighboring in the X direction of the LCD driver 3 is also shown. In addition, a size (y3) in the Y direction of the protective element forming region 19 is shown. Plural (three) p-type semiconductor regions 23 (or n-type semiconductor regions 25) are formed in one n-type semiconductor region 22 (or p-type semiconductor region 24).

For the pad 16, a pair of diodes associated with one pad 16, that is, the two protective elements 21a, 21b for one output are formed over the main surface of the semiconductor chip 11 in order to protect the driver output circuit against an electrostatic breakdown by the positive/negative surge. The protective element 21a and the protective element 21b are arranged in threes, respectively, that is, a total of six protective elements are laid out on the same straight line in the Y direction and further, they are laid out adjacent to each other in the X direction.

As described in the above-mentioned second embodiment, in order to suppress the increase in chip size and to make the length in the direction of the short side of the LCD driver 2 shorter against the increase in the number of outputs of the driver output circuit 12, it is necessary to narrow the pitch between the pads 16 and shorten the length in the Y direction of the protective element forming region 19.

Because of this, in the third embodiment of the present invention, the protective element 21a and the protective element 21b are laid out in threes, respectively, on the same straight line in the Y direction of the protective element forming region 19 and three pads are laid out over the regions of the three protective elements 21a and the three protective elements 21b. In other words, the amount of increase in the number of protective elements 21a, 21b according to the increase in the number of outputs, is distributed in the two-axis directions (X directions) instead of the one-axis direction as illustrated, for example, in FIG. 6, where the size of the protective element forming region 19 in the Y direction is yb. Because of this, the size (y3) in the Y direction of the protective element forming region 19 in FIG. 19 becomes smaller than the size (yb) of that in FIG. 6 and it is possible to reduce the chip size as much as possible in accordance with the demand from the LCD driver 3 to shorten the length in the direction of the short side (Y direction) more than that in the lengthwise direction (X direction).

As described above, it is possible to reduce the chip size of the LCD driver 3 as much as possible. Due to this, it is possible to increase the number of chips to be obtained.

In addition, it is possible to make the length in the direction of the short side of the LCD driver 3 shorter. Due to this, it is possible to extend the screen size of the liquid crystal display 55 in the direction of the source line. In addition, since it is possible to make the length in the direction of the short side of the LCD driver 3 shorter, it is also possible to reduce the frame 51a that covers the periphery of the liquid crystal display 55 (the region in which the LCD driver 2 is mounted).

As described above, the invention developed by the present inventors will be described based on the embodiments, however, the present invention is not limited to the above-mentioned embodiments and it is needless to say that various modifications are possible within the scope not departing from its gist.

For example, in the above-mentioned embodiments, cases of application to the LCD driver are described, however, the present invention is not limited to this, and it is possible to apply the present invention to a semiconductor device in which a protective element is arranged between an external electrode, such as a pad, bump, etc., and its semiconductor circuit in order to protect the semiconductor circuit.

The present invention is widely used in the manufacturing industry of semiconductor devices.

What is claimed is:

1. An electrostatic discharge (ESD) protection device for a driver, comprising:
    a plurality of n-type elements disposed in a p-well region and arranged to form a first pn-junction diode for protection of an output circuit; and
    a plurality of p-type elements disposed in an n-well region and arranged to form a second pn-junction diode for protection of the output circuit;
    wherein each said n-type element is electrically connected with a corresponding one of said p-type elements by a connection region of a multilayer interconnect wiring; and
    said connection regions each having end portions disposed in an interdigitated arrangement.

2. The ESD protection device of claim 1, further comprising:
    a plurality of pads each formed over one of said first pn-junction diode and said second pn-junction diode and over a portion of said first pn-junction diode and said second pn-junction diode,
    wherein said first and second pn-junction diodes are each electrically connected between the pad and the output circuit,
    wherein a cathode of said first pn-junction diode is connected to a voltage supply, and
    wherein an anode of said second pn-junction diode is connected to a potential lower than said voltage supply.

3. The ESD protection device of claim 1,
wherein said multilayer interconnect wiring comprises a plurality of wiring layers formed in interlayer insulating films,
wherein a first one of said wiring layers connects an anode of said first pn-junction diode and a cathode of said second pn-junction diode,
wherein said pad is an uppermost one of said wiring layers,
wherein said pads are arranged along an edge of a driver integrated circuit in a first direction with a pitch between each adjacent pad, and
wherein a surface area of said first and second pn-junction diodes is distributed in both said first direction and in a second direction.

4. The ESD protection device of claim 1,
wherein said output circuit is one of a gate driver and a source driver, and said first and second pn-junction diodes are configured to protect the output circuit against electrostatic breakdown caused by a positive or negative current surge at the pad.

5. An electrostatic discharge (ESD) protection device for a driver, comprising:
first and second n-type elements disposed in a p-well region and arranged to form a first pn-junction diode for protection of an output circuit; and
first and second p-type elements disposed in an n-well region and arranged to form a second pn-junction diode for protection of the output circuit;
wherein the first n-type element and the first p-type element are electrically connected by a first connection region of a multilayer interconnect wiring; and
wherein the second n-type element and the second p-type element are electrically connected by a second connection region of said multilayer interconnect wiring;
said first and second connection regions having end portions disposed in an interdigitated arrangement.

6. The ESD protection device of claim 5, further comprising:
a plurality of pads each formed over one of said first pn-junction diode and said second pn-junction diode and over a portion of the other of said first pn-junction diode and said second pn-junction diode,
wherein said first and second pn-junction diodes are each electrically connected between the pad and the output circuit,
wherein a cathode of said first pn-junction diode is connected to a voltage supply, and
wherein an anode of said second pn-junction diode is connected to a potential lower than said voltage supply.

7. The ESD protection device of claim 5,
wherein said multilayer interconnect wiring comprises a plurality of wiring layers formed in interlayer insulating films,
wherein a first one of said wiring layers connects an anode of said first pn-junction diode and a cathode of said second pn-junction diode, and
wherein said pad is an uppermost one of said wiring layers.

8. The ESD protection device of claim 5,
wherein said pads are arranged along an edge of a driver integrated circuit in a first direction with a pitch between each adjacent pad, and
wherein a surface area of said first and second pn-junction diodes is distributed in both said first direction and in a second direction.

9. The ESD protection device of claim 5,
wherein said output circuit is one of a gate driver and a source driver, and said first and second pn-junction diodes are configured to protect the output circuit against electrostatic breakdown caused by a positive or negative current surge at the pad.

10. A semiconductor device comprising:
an LCD driver having a plurality of protective elements in a driver output circuit,
wherein said plurality of protective elements includes
a first diode having a first p-type semiconductor region formed in a semiconductor substrate and a second n-type semiconductor region formed in the first p-type semiconductor region,
a second diode having the first p-type semiconductor region and a third n-type semiconductor region formed in the first p-type semiconductor region,
a third diode having a first n-type semiconductor region formed in the semiconductor substrate and a second p-type semiconductor region formed in the first n-type semiconductor region, and
a fourth diode having the first n-type semiconductor region and a third p-type semiconductor region formed in the first n-type semiconductor region,
wherein the semiconductor device has a planar shape of a rectangle,
wherein a plurality of first pads are arranged along a long side of the semiconductor device,
wherein a plurality of second pads are also arranged along the long side of the semiconductor device in a staggered offset arrangement with respect to said plurality of first pads in a direction of said long side,
wherein the first, second, third, and fourth diodes are sequentially arranged along a direction of a short side of the semiconductor device,
wherein each of said plurality of first pads is formed over corresponding ones of at least the first and second diodes such that each of said plurality of first pads overlaps at least the first and second diodes in plan view,
wherein the first and third diodes are electrically connected with said one of said plurality of first pads, and
wherein the second and fourth diodes are electrically connected with said one of said plurality of second pads.

11. The semiconductor device according to claim 10, wherein the driver output circuit is a source driver.

12. The semiconductor device according to claim 10, wherein the driver output circuit is a gate driver.

13. The semiconductor device according to claim 10, wherein a plurality of bump electrodes is formed on the plurality of first pads and the plurality of second pads.

14. The semiconductor device according to claim 10, wherein a plurality of bump electrodes is formed on the plurality of first pads and the plurality of second pads.

* * * * *